(12) United States Patent
Tsuji

(10) Patent No.: US 12,328,119 B2
(45) Date of Patent: Jun. 10, 2025

(54) TRANSMISSION CIRCUIT

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 42 days.

(21) Appl. No.: 18/296,177

(22) Filed: Apr. 5, 2023

(65) Prior Publication Data

US 2023/0238963 A1 Jul. 27, 2023

Related U.S. Application Data

(63) Continuation of application No. PCT/JP2021/036573, filed on Oct. 4, 2021.

(30) Foreign Application Priority Data

Oct. 7, 2020 (JP) .................... 2020-169768

(51) Int. Cl.
*H03K 17/00* (2006.01)
*H03K 17/691* (2006.01)
(Continued)

(52) U.S. Cl.
CPC ... *H03K 19/017545* (2013.01); *H03K 17/691* (2013.01); *H03K 17/723* (2013.01)

(58) Field of Classification Search
CPC ............... H03K 17/723; H03K 17/691; H03K 19/017545
See application file for complete search history.

(56) References Cited

U.S. PATENT DOCUMENTS 8,823,438 B2 * 9/2014 Yanagishima ........... H03K 3/01
327/295
8,873,644 B1 10/2014 Todsen et al.
(Continued)

FOREIGN PATENT DOCUMENTS

| JP | 2008288809 A | 11/2008 |
| JP | 2015015697 A | 1/2015 |
| JP | 2017525166 A | 8/2017 |

OTHER PUBLICATIONS

International Search Report, Date of Mailing, Nov. 2, 2021, and Written Opinion of the International Searching Authority for International Application No. PCT/JP2021/036573; Issued on Mar. 28, 2023.

(Continued)

*Primary Examiner* — Tuan T Lam
(74) *Attorney, Agent, or Firm* — CANTOR COLBURN LLP

(57) ABSTRACT

A primary transmitter drives a primary-side input of an isolation barrier in response to a transition of an input signal. A secondary receiver generates an output signal having a logical value that corresponds to a signal that occurs at a secondary-side output of the isolation barrier. A secondary transmitter drives a secondary-side input of the isolation barrier based on the output signal. A primary receiver generates a return signal having a logical value that corresponds to a signal that occurs at a primary-side output of the isolation barrier. The primary transmitter repeatedly drives the primary-side input of the isolation barrier until the logical value of the input signal matches that of the return signal.

10 Claims, 19 Drawing Sheets

(51) Int. Cl.
*H03K 17/723* (2006.01)
*H03K 19/0175* (2006.01)

(56) References Cited

U.S. PATENT DOCUMENTS

| | | | |
|---|---|---|---|
| 9,853,749 B2 | 12/2017 | Bessegato et al. | |
| 10,014,856 B2 * | 7/2018 | Uchida | H03K 3/3565 |
| 2012/0212251 A1 * | 8/2012 | Yanagishima | H03K 17/691 |
| | | | 324/762.01 |
| 2014/0361810 A1 * | 12/2014 | Sasabe | H04L 25/0274 |
| | | | 326/63 |

OTHER PUBLICATIONS

Zhang et al., "Common Mode Transient Immunity (CMTI) for UCC2122x Isolated Gate Divers", Texas Instruments; Application Report, SLUA909—Aug. 2018, 9 pages.
JPO Notice of Reasons for Refusal for corresponding JP Application No. 2022-555459; Issued Apr. 8, 2025.

* cited by examiner

TRANSMISSION CIRCUIT

CROSS REFERENCES TO RELATED APPLICATIONS

The present invention claims priority under 35 U.S.C. § 119 to Japanese Application, 2020-169768, filed on Oct. 7, 2020, the entire contents of which being incorporated herein by reference.

BACKGROUND

1. Technical Field

The present disclosure relates to signal transmission between two isolated regions.

2. Description of the Related Art

In-vehicle systems, industrial systems, medical device systems, etc., such as commercial power supply systems, motor systems, measurement device systems, etc., require high electrical isolation in digital signal transmission between semiconductor chips (i) to protect the human body and devices from surge current and high voltage, (ii) to provide noise isolation so as to prevent abnormal operation, and (iii) to protect transistors in signal transmission between regions with a high voltage difference.

Examples of signal transmission proposed so as to provide isolation include wireless signal transmission, photocoupler signal transmission, capacitor signal transmission, Giant Magneto Resistive (GMR) signal transmission, etc.

In digital signal transmission via an isolation barrier, there is the potential for abnormal operation to occur due to external noise such as a large change in common voltage (reference voltage) or the like even in a case in which there is no transition in an input logical signal, leading to a problem in that matching cannot be obtained in the logical signal level between the primary side (transmission TX side) and the secondary side (reception RX side).

It is difficult for this problem to be allowed in systems requiring reliability such as medical device systems, aerospace equipment systems, in-vehicle/industrial device systems, etc.

In order to solve such a problem, an electrical countermeasure is applied to a communication IC provided with an isolation barrier in order to provide improved Common Mode Transient Immunity (CMTI). In addition, a system-type countermeasure is further provided.

Examples of such a system-type countermeasure that have been proposed will be described below.

Conventional Example 1

In a conventional example 1, even if there is no transition in the input logical signal for a predetermined period of time, the TX side periodically transmits a refresh pulse using a timer, so as to compensate for transmission failure and logic mismatch between the TX side and the RX side when no signal is transmitted. If there is no logical signal transition for a predetermined period of time on the RX side, the output is set to a safe level determined beforehand using a watchdog timer.

Conventional Example 2

In a conventional example 2, On-Off Keying (OOK) or Frequency Shift Keying (FSK) is employed so as to judge whether the logical state is the low state or the high state at all times. This allows the logical value to be immediately corrected to a correct value even if signal transition occurs due to abnormal operation.

Typical examples of such an electrical countermeasure that have been employed will be described below.

A transformer using magnetic field coupling is employed so as to prevent the occurrence of noise transmission via an electrical field between the primary side and the secondary side.

Differential signal transmission is provided between the primary side and the secondary side. Such differential signal transmission is almost indispensable for capacitor signal transmission (electrical field coupling) having low CMTI.

Transmission power is increased so as to raise the S/N ratio. This method requires an increase in electrical power, and accordingly, has a limitation.

Standard circuit design is employed as such a countermeasure, examples of which include noise removal using a filter, employment of a circuit with a hysteresis function, etc. It should be noted that, in a case in which the frequency is low, or the voltage level has a low S/N ratio, such a method has a limitation.

As a result of investigating the conventional countermeasures, the present inventor has come to recognize the following problems.

Conventional Example 1

When a logic mismatch occurs between the primary side and the secondary side, a delay in recovery occurs due to the timer cycle. Also, in a case in which the refresh cycle is long, such an example must allow the logic mismatch state to continue for a long period of time. However, in a case in which a short refresh cycle is employed, this leads to increased power consumption. With this, it is difficult to determine the optimum cycle, which changes according to the situation.

In addition, if a transmission failure continues, such an example is not able to correct the signal level on the RX side. The watchdog timer on the RX side is not provided in order to provide logic matching, but rather to provide a Fail-Safe function in a situation in which signal transmission cannot be supplied, e.g., in a malfunction state.

Both the TX side and the RX side require a peripheral circuit (oscillator etc.) that operates at all times for a timer. This leads to power consumption even if no signal is transmitted. Furthermore, such an example leads to an increased area cost.

Conventional Example 2

Such an example involves large power consumption due to the transmission of a carrier frequency. This leads to the occurrence of power consumption even when no signal is transmitted. Furthermore, a demodulator circuit requires a constant current for a bias circuit or the like, leading to an increased area cost. In addition, as unavoidable problems, such an arrangement leads to Electro-Magnetic Interference (EMI) degradation due to the carrier frequency, or increased power consumption and an increased circuit area due to a countermeasure circuit (spectrum spread).

As described above, such conventional methods employ an excessively complicated configuration requiring many components and a large circuit area. That is to say, the conventional methods have many disadvantages. Accordingly, it is difficult to implement such a circuit, which becomes a barrier to providing reduced costs and reduced power consumption.

SUMMARY

The present disclosure has been made in order so solve such problems.

An embodiment according to the present disclosure relates to a transmission circuit. The transmission circuit includes: an isolation barrier; a primary transmitter structured to drive a primary-side input of the isolation barrier in response to a transition of an input signal; a secondary receiver structured to generate an output signal having a logical value that corresponds to a signal that occurs at a secondary-side output of the isolation barrier; a secondary transmitter structured to drive a secondary-side input of the isolation barrier based on the output signal; and a primary receiver structured to generate a return signal having a logical value that corresponds to a signal that occurs at a primary-side output of the isolation barrier. The primary transmitter repeatedly drives the primary-side input of the isolation barrier until the logical value of the input signal matches the logical value of the return signal.

It should be noted that any combination of the components described above, or manifestation of the present disclosure may be mutually substituted between a method, apparatus, and so forth, which are also effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
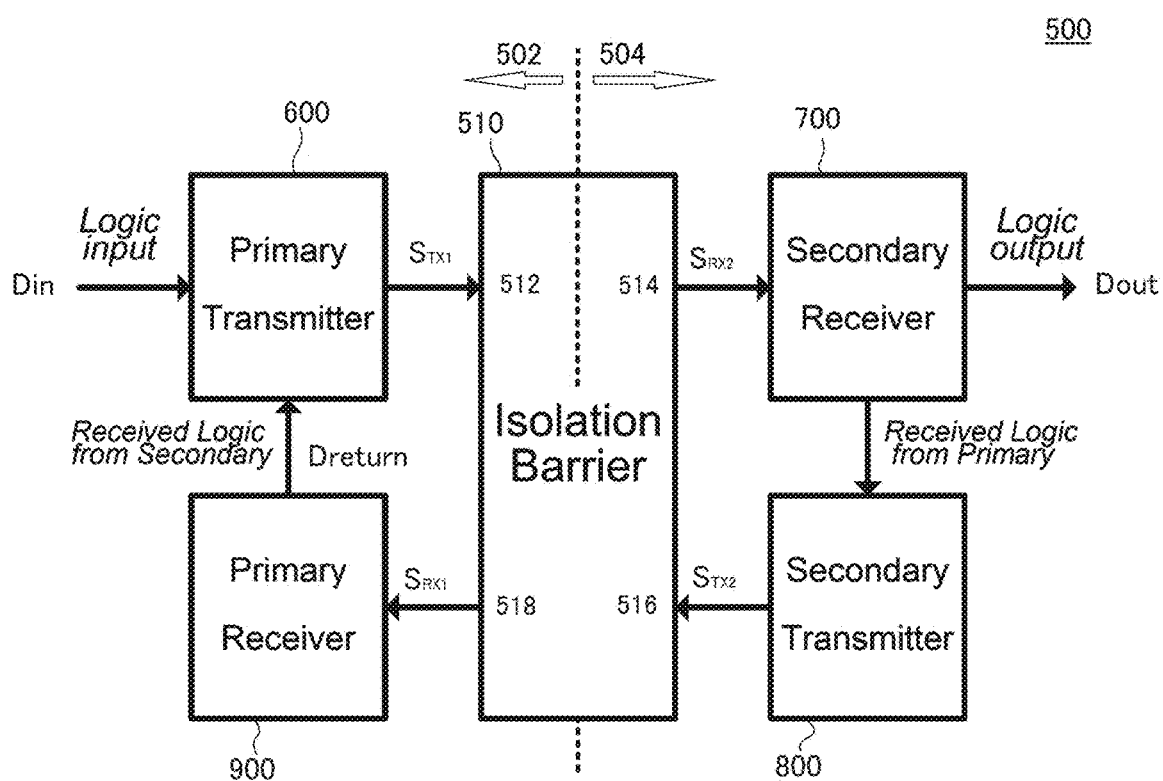
FIG. 1 is a circuit diagram of a transmission circuit according to an embodiment.

Description will be made regarding the outline of several exemplary embodiments of the present disclosure. The outline is a simplified explanation regarding several concepts of one or multiple embodiments as a prelude to the detailed description described later in order to provide a basic understanding of the embodiments. That is to say, the outline described below is by no means intended to restrict the scope of the present invention and the present disclosure. Furthermore, the outline described below is by no means a comprehensive outline of all the possible embodiments. That is to say, the outline described below by no means restricts essential components of the embodiments. For convenience, in some cases, an "embodiment" as used in the present specification represents a single or multiple embodiments (examples and modifications) disclosed in the present specification.

A transmission circuit according to one embodiment includes: an isolation barrier; a primary transmitter structured to drive a primary-side input of the isolation barrier in response to a transition of an input signal; a secondary receiver structured to generate an output signal having a logical value that corresponds to a signal that occurs at a secondary-side output of the isolation barrier; a secondary transmitter structured to drive a secondary-side input of the isolation barrier based on the output signal; and a primary receiver structured to generate a return signal having a logical value that corresponds to a signal that occurs at a primary-side output of the isolation barrier. The primary transmitter repeatedly drives the primary-side input of the isolation barrier until the logical value of the input signal matches the logical value of the return signal.

With the transmission circuit including a return channel configured to return information from the secondary side to the primary side as an additional component, this allows the primary transmitter to know whether or not the information has been transmitted correctly. With this, the signal transmission is repeated until the information has been transmitted correctly, thereby allowing the signal to be transmitted to the secondary side in a sure manner. This requires a minimum number of retransmissions, thereby providing matching with small power consumption. It should be noted that the primary-side input and the primary-side output of the isolation barrier may be configured as independent ports or may be configured as the same port. Similarly, the secondary-side input and the secondary-side output of the isolation barrier may be configured as independent ports or may be configured as the same port.

In one embodiment, the primary transmitter may include: a first comparison circuit structured to compare the logical value of the input signal with the logical value of the return signal; a first oscillation circuit structured such that oscillation and stoppage are controlled according to a comparison result obtained by the first comparison circuit; and a first output unit structured to drive the primary-side input of the isolation barrier according to the input signal and a first pulse signal generated by the first oscillation circuit. With this configuration, this is capable of repeatedly driving the primary-side input of the isolation barrier during a period in which the input signal and the return signal are mismatched.

In one embodiment, the first oscillation circuit may include a ring oscillator.

In one embodiment, when the input signal is high, the primary transmitter may pulse-drive the primary side of the isolation barrier with a first polarity. Also, when the input signal is low, the primary transmitter may pulse-drive the primary side of the isolation barrier with a second polarity.

In one embodiment, the isolation barrier may include a first transformer having a primary winding coupled to the primary transmitter, and a secondary winding coupled to the secondary receiver. When the input signal is high, the primary transmitter may supply a pulse current having a first polarity to the primary winding of the first transformer. Also, when the input signal is low, the primary transmitter may generate a pulse current having a second polarity. Also, the secondary receiver may include: a latch circuit having a set terminal coupled to one end of the secondary winding of the first transformer and a reset terminal coupled to the other end of the secondary winding of the transformer; a first switch coupled between the set terminal and a common voltage node at which a common voltage occurs, and structured to turn on when an output of the latch circuit is high; and a second switch coupled between the common voltage node and the reset terminal, and structured to turn on when the output of the latch circuit is low.

With this configuration in which the first switch and the second switch are controlled according to the state of the latch circuit so as to control the state of the secondary winding of the first transformer, this provides an operation equivalent to that provided by a pulse set/reset transmission circuit using only a single transformer. This configuration requires only a single transformer to provide an advantage of such a pulse set/reset transmission circuit. Accordingly, this allows the circuit area to be reduced. Furthermore, this is capable of solving a transmission rate limitation due to skew variation between two transformers. Accordingly, this provides transmission with a higher rate.

In one embodiment, the secondary receiver may further include a switch control unit structured to control the first switch and second switch according to a state of the latch circuit. Also, after a transition of a pulse current having the first polarity, the switch control unit may turns off the second switch. Also, after a transition of a pulse current having the second polarity, the switch control unit may turn off the first switch. This is capable of suppressing the occurrence of a surge in the terminal voltage of the secondary winding, thereby providing improved stability.

In one embodiment, when a predetermined time period elapses after the first switch turns on, the switch control unit may turn off the second switch. Also, when a predetermined time period elapses after the second switch turns on, the switch control unit may turn off the first switch. With this arrangement in which a period is inserted such that both the first switch and the second switch are turned on, so as to fix the voltages at the set terminal and the reset terminal, this is capable of prohibiting state transmission in the latch circuit. This allows the circuit operation to be further stabilized.

In one embodiment, after the logical value of the input signal matches the logical value of the return signal, the primary transmitter may drive the primary-side input of the isolation barrier once as an additional operation. Also, during a period in which there is a mismatch between a current output signal and an immediately previous output signal, the secondary transmitter repeatedly drives the secondary-side input of the isolation barrier. With this configuration, after the return signal is transmitted correctly, the secondary transmitter stops its operation. This provides immunity with respect to the occurrence of an abnormality in the return channel.

In one embodiment, the secondary transmitter may include: a second comparison circuit structured to compare an immediately previous logical value of the output signal with a current logical value of the output signal; a second oscillation circuit structured to control oscillation and stoppage according to a comparison result obtained by the second comparison circuit; and a second output unit structured to drive the secondary-side input of the isolation barrier according to a second pulse signal generated by the second oscillation circuit during a period in which the second oscillation circuit oscillates.

In one embodiment, the transmission circuit may further include a glitch remover circuit structured to remove a glitch from an output of the secondary receiver.

In one embodiment, as the common voltage, the ground voltage may be employed. Also, the first switch and the second switch may each be configured as an NMOS transistor.

In one embodiment, as the common voltage, the power supply voltage may be employed. Also, the first switch and the second switch may each be configured as a PMOS transistor.

In one embodiment, the latch circuit may include a first NOR gate and a second NOR gate cross-coupled to each other.

In one embodiment, the latch circuit may include a first NAND gate and a second NAND gate cross-coupled to each other.

In one embodiment, as the common voltage, the ground voltage may be employed. Also, the first switch and the second switch may each be configured as an NMOS transistor. The transmission circuit may further include a first inverter having its input node receiving the inverted output of the latch circuit and its output node coupled to the gate of the first switch, and a second inverter having its input node receiving the output of the latch circuit and its output node coupled to the gate of the second switch.

In one embodiment, as the common voltage, the ground voltage may be employed. Also, the first switch and the second switch may each be configured as an NMOS transistor. The transmission circuit may further include: a first NAND gate having its input node receiving the inverted output of the latch circuit and its output node coupled to the gate of the first switch; a first delay circuit structured to delay the output of the first NAND gate; a second NAND gate having its first input node receiving the output of the latch circuit, the output of the first delay circuit is received via its second input node, and its output node is coupled to the gate of the second switch; and a second delay circuit structured to delay the output of the second NAND gate, and to supply the output thus delayed to the second input node of the first NAND gate.

In one embodiment, as the common voltage, the power supply voltage may be employed. Also, the first switch and the second switch may each be configured as a PMOS transistor. The transmission circuit may further include a third inverter having its input node receiving the output of the latch circuit and its output node coupled to the gate of the first switch, and a fourth inverter having its input node receiving an inverted output of the latch circuit, and its output node coupled to the gate of the second switch.

EMBODIMENTS

Description will be made below regarding preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electrical connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C, via another member that does not substantially affect the electrical connection between them, or that does not damage the functions or effects of the connection between them, in addition to a state in which they are directly coupled.

FIG. 1 is a circuit diagram showing a transmission circuit 500 according to an embodiment. The transmission circuit 500 includes an isolation barrier 510, a primary transmitter 600, a secondary receiver 700, a secondary transmitter 800, and a primary receiver 900. The transmission circuit 500 is configured such that an input signal $D_{in}$ is received via a primary side 502 thereof, and a secondary side 504 thereof generates an output signal $D_{out}$ having a logical value that corresponds to the input signal $D_{in}$.

The isolation barrier 510 is configured as a passive element such as a transformer, capacitor, or the like, so as to secure electrical isolation between the primary side 502 and the secondary side 504. The isolation barrier 510 includes a primary-side input 512, a secondary-side output 514, a secondary-side input 516, and a primary-side output 518. When the primary-side input 512 is driven, this changes the electrical state of the secondary-side output 514. Similarly, when the secondary-side input 516 is driven, this changes the electrical state of the primary-side output 518. It should be noted that the primary-side input 512 and the primary-side output 518 may be configured as the same port. Also, the secondary-side output 514 and the secondary-side input 516 may be configured as the same port.

The primary transmitter 600 drives the primary-side input 512 of the isolation barrier 510 in response to the transition of the input signal $D_{in}$. An electrical signal $S_{RX2}$ occurs at the secondary-side output 514 of the isolation barrier 510 according to the driving of the primary transmitter 600. There is a difference in the driving mode (which is understood as the pattern, waveform, or polarity of the driving signal $S_{TX1}$) of the primary transmitter 600 between a case in which the input signal $D_{in}$ transits from low to high and a case in which the input signal $D_{in}$ transits from high to low. As a result, the secondary-side output 514 generates an electrical signal $S_{RX2}$ having a distinguishable state.

The secondary receiver 700 generates an output signal $D_{out}$ having a logical value that corresponds to the mode of the electrical signal $S_{RX2}$ that occurs at the secondary-side output 514 of the isolation barrier 510, i.e., a logical value that corresponds to the electrical state of the secondary-side output 514. When a signal is transmitted normally, the logical value of the output signal $D_{out}$ matches the logical value of the input signal $D_{in}$.

The primary transmitter 600 and the secondary receiver 700 form a forward channel configured to transmit the input signal $D_{in}$ from the primary side 502 to the secondary side 504.

The secondary transmitter 800 drives the secondary-side input 516 of the isolation barrier 510 in response to the transition of the output signal $D_{out}$. An electrical signal $S_{RX1}$ occurs at the primary-side output 518 of the isolation barrier 510 according to the driving of the secondary transmitter 800. There is a difference in the driving mode (which is understood as the pattern, waveform, or polarity of the driving signal $S_{TX2}$) of the secondary transmitter 800 between a case in which the output signal $D_{out}$ transits from low to high and a case in which the output signal $D_{out}$ transits from high to low. As a result, an electrical signal $S_{RX1}$ having a distinguishable state will be generated at the primary-side output 518.

The primary receiver 900 generates a return signal $D_{au}$m having a logical value that corresponds to the mode of the signal $S_{RX1}$ that occurs at the primary-side output 518 of the isolation barrier 510, i.e., a logical value that corresponds to the electrical state of the primary-side output 518.

The secondary transmitter 800 and the primary receiver 900 form a return channel configured to return the output signal $D_{out}$ from the secondary side 504 to the primary side 502.

The primary transmitter 600 repeats the driving of the primary-side input 512 of the isolation barrier 510 until the logical value of the input signal $D_{in}$ matches the logical value of the return signal $D_{return}$.

It should be noted that the electrical signals $S_{TX1}$, $S_{RX2}$, $S_{TX2}$, and $S_{RX1}$ may each be a voltage signal or may each be a current signal.

The above is the basic configuration of the transmission circuit 500. Next, description will be made regarding the operation thereof.

Figure 2:
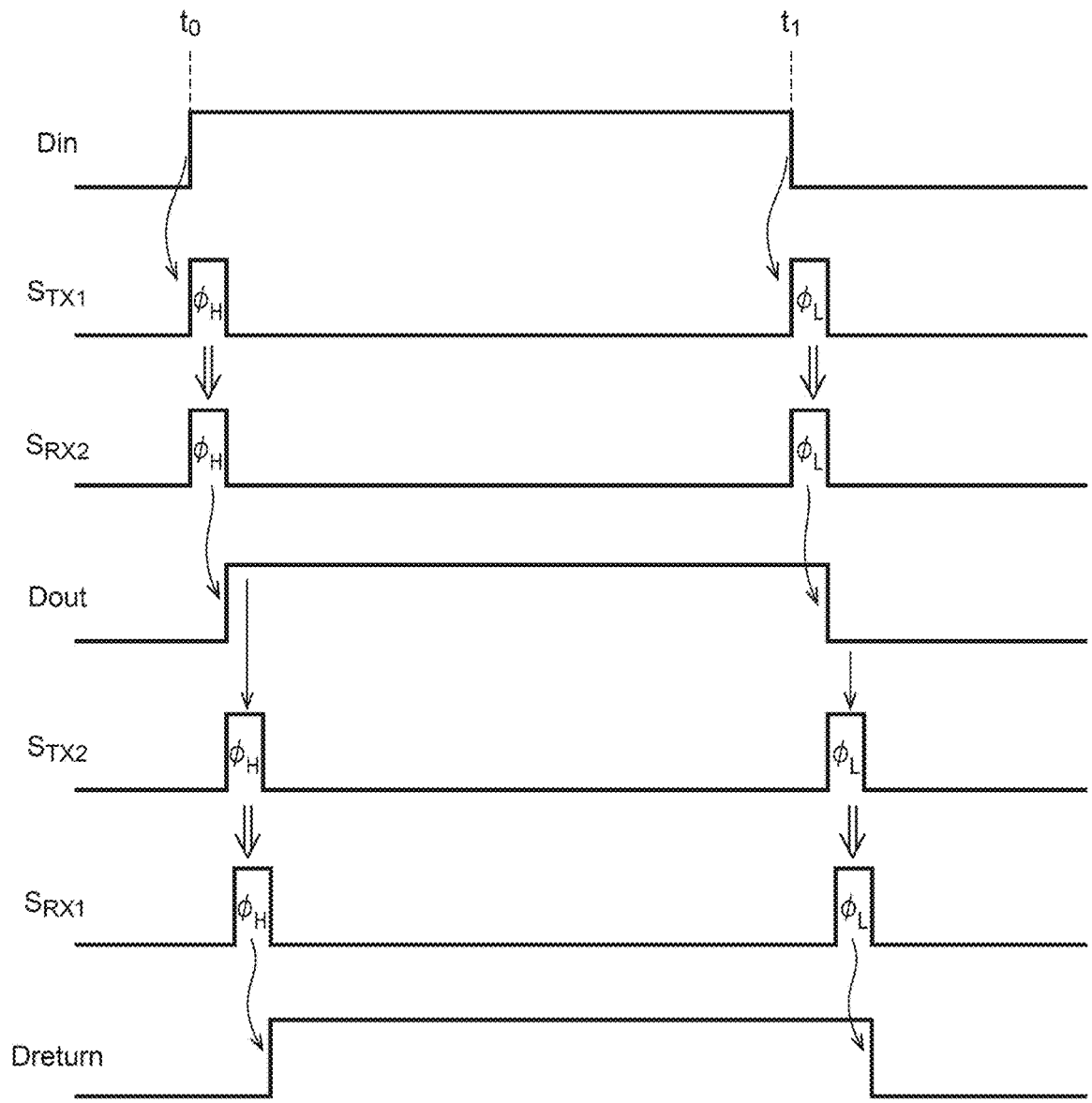
FIG. 2 is a time chart shows a normal operation of the transmission circuit shown in FIG. 1.

FIG. 2 is a time chart showing a normal operation of the transmission circuit 500 shown in FIG. 1. When the input signal $D_{in}$ transits from low to high at the time point $t_0$, the primary transmitter 600 generates the electrical signal $S_{TX1}$ in a first state $\phi_H$. As a result, the secondary-side output 514 of the isolation barrier 510 generates the electrical signal $S_{RX2}$ in the first state $\phi_H$. Upon detecting the electrical signal $S_{RX2}$ in the first state $\phi_H$, the secondary receiver 700 outputs the high output signal $D_{out}$.

When the output signal $D_{out}$ transits to high, the secondary transmitter 800 generates the electrical signal $S_{TX2}$ in the first state $\phi_H$. As a result, the primary-side output 518 of the isolation barrier 510 generates the electrical signal $S_{RX1}$ in the first state $\phi_H$. Upon detecting the electrical signal $S_{RX1}$ in the first state $\phi_H$, the primary receiver 900 outputs the high return signal $D_{return}$.

In the normal operation of the transmission circuit 500, immediately after the input signal $D_{in}$ transits to high, the return signal $D_{return}$ transits to high. As a result, the logical value of the input signal $D_{in}$ matches the logical value of the return signal $D_{return}$. Accordingly, the primary transmitter 600 stops the generation of the electrical signal $S_{TX1}$ in the first state $\phi_H$ and waits for the transition of the next input signal $D_{in}$.

When the input signal $D_{in}$ transits from high to low at the time point $t_1$, the primary transmitter 600 generates the electrical signal $S_{TX1}$ having the second state $\phi_L$. As a result, the electrical signal $S_{RX2}$ in the second state $\phi_L$ occurs at the secondary-side output 514 of the isolation barrier 510. Upon detecting the electrical signal $S_{RX2}$ in the second state k, the secondary receiver 700 outputs the low output signal $D_{out}$.

When the output signal $D_{out}$ transits to low, the secondary transmitter 800 generates the electrical signal $S_{TX2}$ in the second state $\phi_L$. As a result, the electrical signal $S_{RX1}$ in the second state $\phi_L$ occurs at the primary-side output 518 of the isolation barrier 510. Upon detecting the electrical signal $S_{RX1}$ in the second state $\phi_L$, the primary receiver 900 outputs the low return signal $D_{return}$.

When the input signal $D_{in}$ transits to low in the normal operation of the transmission circuit 500, the return signal $D_{return}$ immediately transits to low. In this state, the logical value of the input signal $D_{in}$ matches that of the return signal $D_{return}$. Accordingly, the primary transmitter 600 stops the generation of the electrical signal $S_{TX1}$ in the second state $\phi_L$ and waits for the next transmission of the input signal $D_{in}$.

Figure 3:
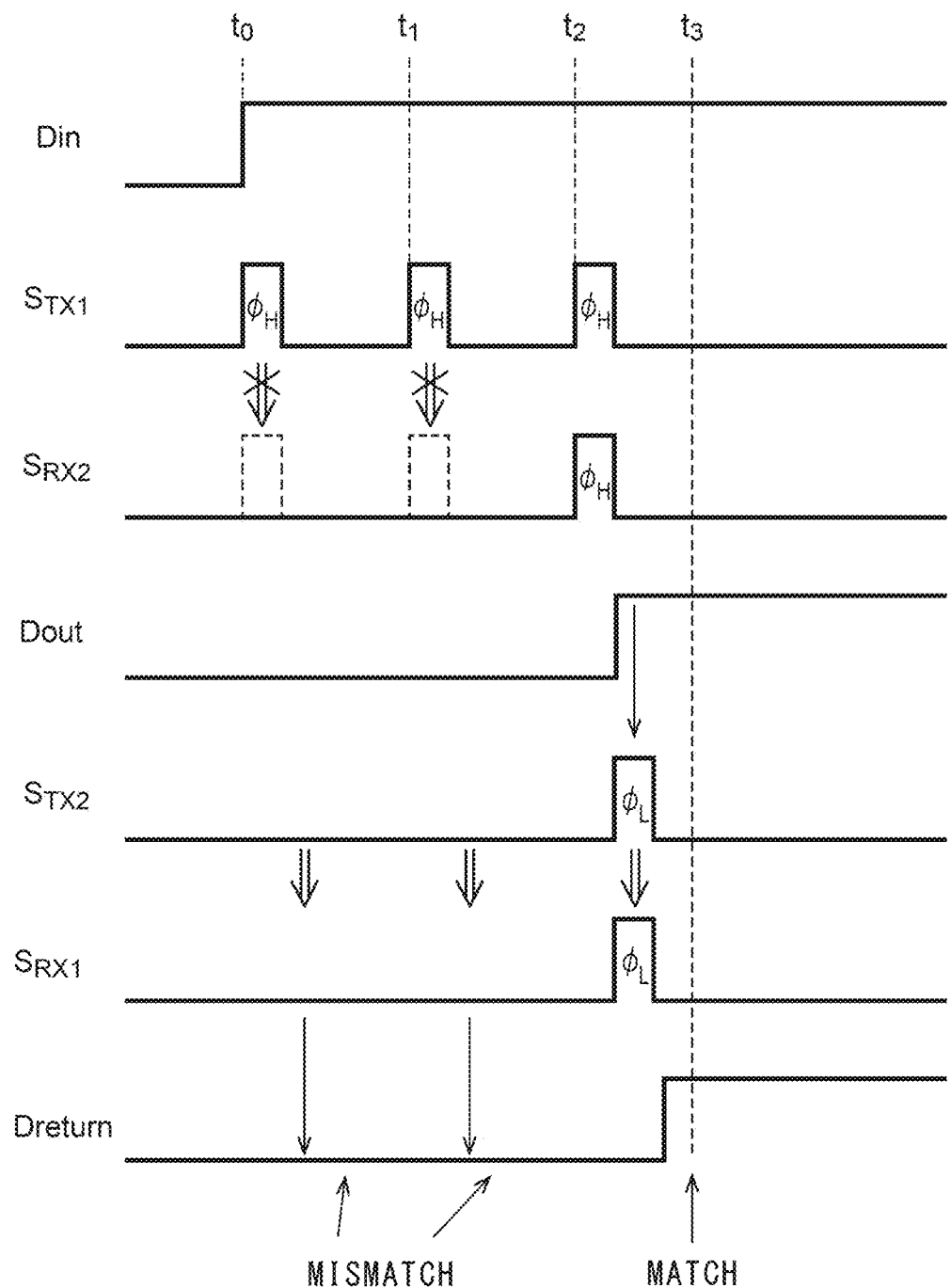
FIG. 3 is a time chart showing an operation of the transmission circuit shown in FIG. 1 when an error has occurred.

FIG. 3 is a time chart showing the operation of the transmission circuit 500 shown in FIG. 1 when an error has occurred. When the input signal $D_{in}$ transits from low to high at the time point $t_0$, the primary transmitter 600 generates the electrical signal $S_{TX1}$ in the first state $\phi_H$.

Description will be made assuming that the electrical signal $S_{RX2}$ in the first state $\phi_H$ has not occurred at the secondary-side output 514 of the isolation barrier 510 due to the occurrence of a certain abnormality. In this case, the secondary receiver 700 is not able to detect the electrical signal $S_{RX2}$ in the first state $\phi_H$. Accordingly, the output signal $D_{out}$ of the secondary receiver 700 is maintained at low.

In this case, no change occurs in the output signal $D_{out}$. Accordingly, the secondary transmitter 800 does not drive the secondary-side input 516 of the isolation barrier 510. Therefore, no change occurs in the state of the primary-side output 518 of the isolation barrier 510, and the return signal $D_{return}$, which is the output of the primary receiver 900, is maintained at low.

The logical value of the return signal $D_{return}$ does not match that of the input signal $D_{in}$. Accordingly, the primary transmitter 600 generates the electrical signal $S_{TX1}$ in the first state $\phi_H$ again at the time point $t_1$. Description will be made assuming that the electrical signal $S_{RX2}$ in the first state $\phi_H$ again has not occurred at the secondary-side output 514 of the isolation barrier 510 due to the occurrence of a certain abnormality. In this case, the secondary receiver 700 again is not able to detect the electrical signal $S_{RX2}$ in the first state $\phi_H$. Accordingly, the output signal $D_{out}$ is maintained at low.

Since no change occurs in the output signal $D_{out}$, the secondary transmitter 800 does not drive the secondary-side input 516 of the isolation barrier 510. Accordingly, the return signal $D_{return}$, which is the output of the primary receiver 900, is maintained at low.

The logical value of the return signal $D_{return}$ does not match that of the input signal $D_{in}$. Accordingly, the primary transmitter 600 generates the electrical signal $S_{TX1}$ in the first state $\phi_H$ at the time point $t_2$. When the electrical signal $S_{TX1}$ is transmitted normally to the secondary side, the electrical signal $S_{RX2}$ in the first state $\phi_H$ occurs at the secondary-side output 514 of the isolation barrier 510. The secondary receiver 700 outputs the high output signal $D_{out}$.

When the output signal $D_{out}$ transits to high, the secondary transmitter 800 generates the electrical signal $S_{TX2}$ in the first state $\phi_H$. As a result, the electrical signal $S_{RX1}$ in the first state $\phi_H$ occurs at the primary-side output 518 of the isolation barrier 510. Upon detecting the electrical signal $S_{RX1}$ in the first state $\phi_H$, the primary receiver 900 outputs the high return signal $D_{return}$.

As a result, the logical value of the return signal $D_{return}$ matches that of the input signal $D_{in}$. In this state, the primary transmitter 600 stops the generation of the electrical signal $S_{TX1}$ in the first state $\phi_H$.

The above is the operation of the transmission circuit 500. With the transmission circuit 500 further including the return channel configured to return the information from the secondary side 504 to the primary side 502, the primary transmitter 600 is capable of confirming whether or not the information has been transmitted correctly. With this, by repeating the signal transmission until the information is transmitted correctly, this is capable of transmitting the signal to the secondary side 504 in a sure manner.

With the transmission circuit 500, after the signal is transmitted correctly, the transmission circuit 500 stops this operation. Such an arrangement has an advantage of requiring a small increase in power consumption, and an advantage of suppressing EMI.

The present disclosure or the present invention encompasses various kinds of apparatuses and methods that can be regarded as a block configuration or a circuit configuration shown in FIG. 1, or otherwise that can be derived from the aforementioned description. That is to say, the present invention or the present disclosure is not restricted to a specific configuration. More specific description will be made below regarding example configurations and examples for clarification and ease of understanding of the essence of the present invention and the operation thereof. That is to say, the following description will by no means be intended to restrict the technical scope of the present invention.

Example 1

Figure 4:
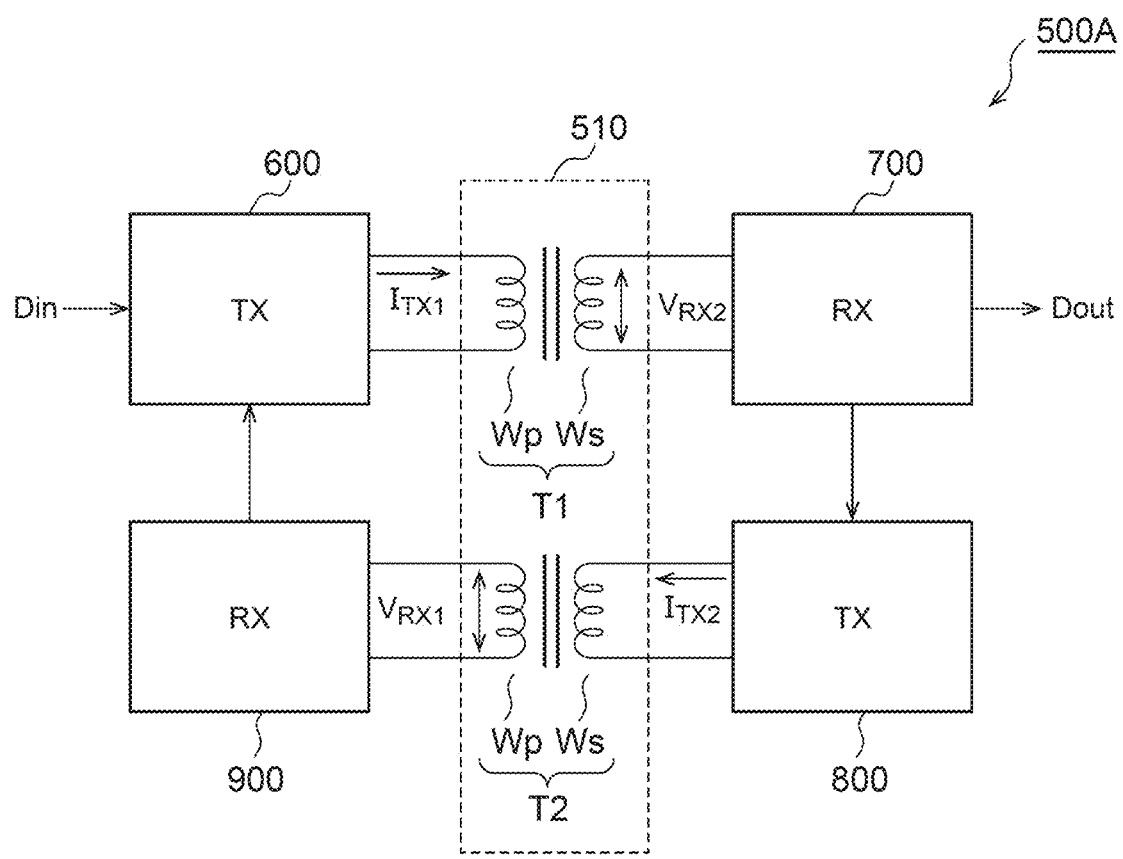
FIG. 4 is a block diagram of a transmission circuit according to an example 1.

FIG. 4 is a block diagram of a transmission circuit 500A according to an example 1. The isolation barrier 510 includes a transformer T1 for a forward channel and a transformer T2 for a return channel. The transformers T1 and T2 each have a primary winding Wp and a secondary winding Ws. The primary winding Wp of the transformer T1 corresponds to the primary-side input 512. The secondary winding Ws of the transformer T1 corresponds to the secondary-side output 514. The secondary winding Ws of the transformer T2 corresponds to the secondary-side input 516. The primary winding Wp of the transformer T2 corresponds to the primary-side output 518.

The primary transmitter 600 supplies a driving signal $I_{TX1}$ to the primary winding Wp of the transformer T1. A voltage signal $V_{RX2}$ that corresponds to the current signal $I_{TX1}$ occurs at the secondary winding Ws of the transformer T1. The current signal $I_{TX1}$ and the voltage signal $V_{RX2}$ correspond to the electrical signals $S_{TX1}$ and $R_{RX2}$ shown in FIG. 1, respectively.

The voltage $V_{RX2}$ that occurs at the secondary winding Ws of the transformer T1 is represented by Expression (1).

$$V_{RX2} = M \cdot dI_{TX1}/dt \quad (1)$$

M is the transconductance, which is represented by $M = k\sqrt{(L_{TX} \cdot L_{RX})}$, where k is the coupling coefficient. $L_{TX}$ and LRX are the self-inductance of the primary winding Wp and the self-inductance of the secondary winding Ws, respectively.

Figure 5:
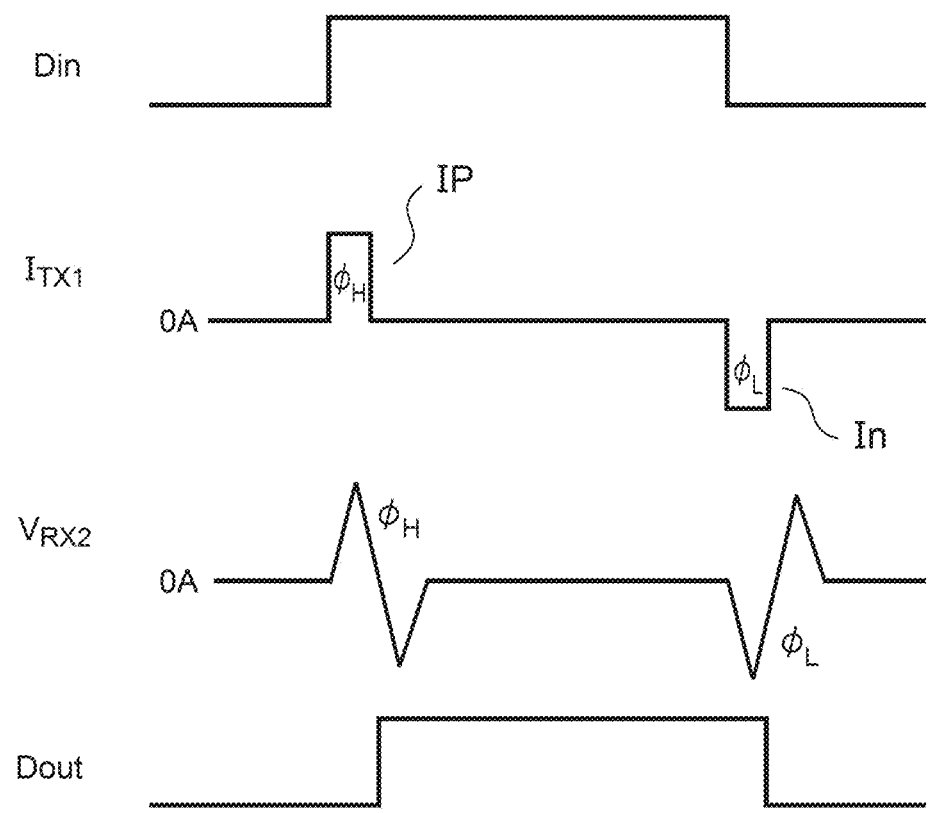
FIG. 5 is a time chart for explaining signal transmission in the example 1.

FIG. 5 is a time chart for explaining the signal transmission in the example 1. In the present example, the primary transmitter 600 supplies the current signal $I_{TX1}$ having a polarity (direction) that changes in response to the change of the level of the input signal $D_{in}$ to the primary winding Wp. Specifically, when the input signal $D_{in}$ transits from low to high, the current signal $I_{TX1}$ is generated as a pulse current Ip having a first polarity, which corresponds to the first state $\phi_H$ of the electrical signal $S_{TX1}$. Conversely, when the input signal $D_{in}$ transits from high to low, the current signal $I_{TX1}$ is generated as a pulse signal In having a second polarity, which corresponds to the second state $\phi_L$ of the electrical signal $S_{TX1}$.

The pulse-shaped voltage signal $V_{RX2}$ having a polarity that corresponds to the polarity of the driving current $I_{TX1}$ occurs at the secondary winding Ws of the transformer T1. The secondary receiver 700 detects the polarity of the voltage signal $V_{RX2}$ and changes the logical value of the output signal $D_{out}$ according to the polarity thus detected. In this example, the output signal $D_{out}$ transits to high according to the voltage signal $V_{RX2}$ having the positive polarity. Furthermore, the output signal $D_{out}$ transits to low according to the voltage signal $V_{RX2}$ having the negative polarity.

Returning to FIG. 4, during a period in which a mismatch occurs in which the input signal $D_{in}$ is high and the return signal $D_{return}$ is low, the primary transmitter 600 repeatedly generates the pulse current Ip having a positive polarity. On the other hand, during a period in which a mismatch occurs in which the input signal $D_{in}$ is low and the return signal $D_{return}$ is high, the primary transmitter 600 repeatedly generates the pulse current Ip having a negative polarity.

The return channel including the secondary transmitter 800, the primary receiver 900, and the transformer T2 may be configured employing the same transmission method as that employed in the forward channel. Specifically, the secondary transmitter 800 supplies the driving current $I_{TX2}$ to the secondary winding Ws of the transformer T2. When the output signal $D_{out}$ transits to high, the current signal $I_{TX2}$ is generated as the pulse current Ip having the first polarity, which corresponds to the first state $\phi_H$ of the electrical signal $S_{TX2}$. Conversely, when the output signal $D_{out}$ transits to low, the current signal $I_{TX2}$ is generated as the pulse current having the second polarity, which corresponds to the second state $\phi_L$ of the electrical signal $S_{TX2}$.

The voltage signal $V_{RX1}$ that corresponds to the current signal $I_{TX2}$ occurs at the primary winding Wp of the transformer T2. The primary receiver 900 detects the polarity of the voltage signal $V_{RX1}$, and changes the logical value of the return signal $D_{return}$ according to the polarity thus detected. For example, the output signal $D_{return}$ transits to high according to the voltage signal $V_{RX1}$ having a positive polarity. Furthermore, the return signal $D_{return}$ transits to low according to the voltage signal $V_{RX1}$ having a negative polarity.

Figure 6:
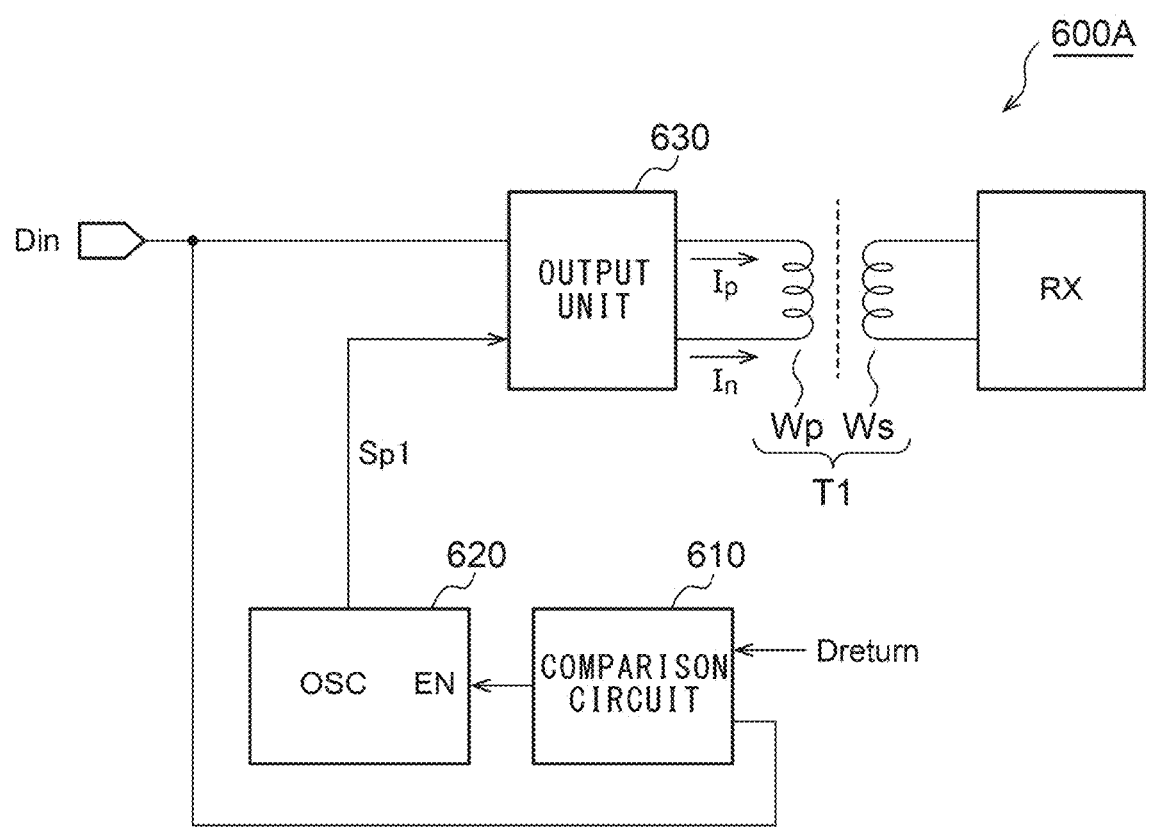
FIG. 6 is a circuit diagram showing an example configuration of a primary transmitter.

FIG. 6 is a circuit diagram showing an example configuration of a primary transmitter 600A. The primary transmitter 600A includes a first comparison circuit 610, a first oscillation circuit 620, and a first output unit 630. The first comparison circuit 610 compares the logical value of the input signal $D_{in}$ with the logical value of the return signal $D_{return}$. The comparison result obtained by the first comparison circuit 610 is input to an enable terminal of the first oscillation circuit 620. When the comparison result is "mismatch", the first oscillation circuit 620 becomes the enable state (oscillation). In this state, the first oscillation circuit 620 generates a first pulse signal Sp1 having a predetermined frequency. When the comparison result is "match", the first oscillation circuit 620 becomes the disable state (stop). The frequency of the first pulse signal Sp1 determines the repetition period of signal transmission retries. Furthermore, the pulse width of the first pulse signal Sp1 determines the pulse width of each of the pulse currents Ip and In.

The first output unit 630 drives the primary-side input 512 of the isolation barrier 510 according to the input signal $D_{in}$ and the first pulse signal Sp1. Specifically, during a period in which the input signal $D_{in}$ is high and the first pulse signal Sp1 is the active level, the first output unit 630 outputs the driving current $I_{TX1}$ (pulse signal 1p) having the first polarity. During a period in which the input signal $D_{in}$ is low, and the first pulse signal Sp1 is the active level, the first output unit 630 outputs the driving current $I_{TX2}$ (pulse signal In) having the second polarity.

Figure 7:
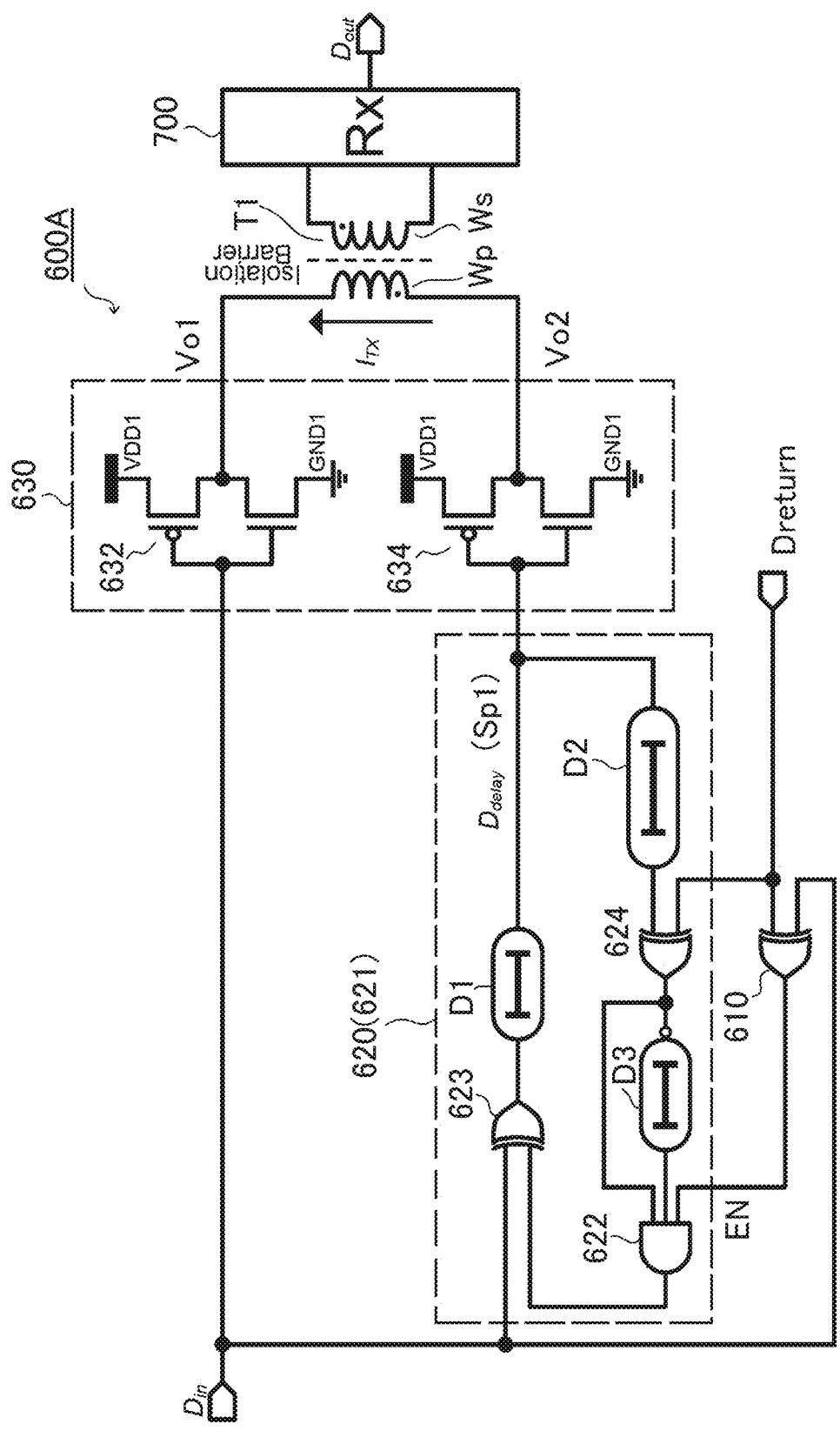
FIG. 7 is a circuit diagram showing a specific example configuration of the primary transmitter.

FIG. 7 is a circuit diagram showing a specific example configuration of the primary transmitter 600A. The first output unit 630 is configured as an H-bridge circuit including a pair of push-pull output stages (inverters) 632 and 634. One output stage 632 inverts the input signal $D_{in}$ and supplies the inverted input signal to one end of the primary winding Wp. During a period in which the input signal $D_{in}$ is high, the output Vo1 of the output stage 632 is low (GND1). During a period in which the input signal $D_{in}$ is low, the output Vo1 of the output stage 632 is high (VDD1).

The output stage 634 inverts the control pulse $D_{delay}$ (pulse signal Sp1 shown in FIG. 6) supplied from the first oscillation circuit 620 and supplies the inverted control pulse to the other end of the primary winding Wp. During a period in which the control pulse $D_{delay}$ is high, the output Vo2 of the output stage 634 is low (GND1). During a period in which the control pulse $D_{delay}$ is low, the output Vo2 of the output stage 634 is high (VDD1).

The first comparison circuit 610 includes an XOR (exclusive-or) gate 612, for example. The first comparison circuit 610 generates a signal that indicates a match or mismatch between the input signal $D_{in}$ and the return signal $D_{return}$, and supplies the signal thus generated to the enable terminal (negative logic system) ENB of the first oscillation circuit 620.

The first oscillation circuit 620 can be regarded as a type of ring oscillator. In the present specification, the first oscillation circuit 620 will be referred to as a pulse output (or intermittent oscillation) ring oscillator 621. During a period in which a high-level signal is input to the enable terminal EN, the pulse output ring oscillator 621 oscillates so as to generate a control pulse $D_{delay}$. The pulse output ring oscillator 621 includes at least one or more delay elements D1 and D2 that determine the frequency (period) of the control pulse $D_{delay}$.

An AND gate 622 and XOR gates 623 and 624 are inserted in the pulse output ring oscillator 621. During a period in which the enable signal EN is low, the AND gate 622 cuts off the pulse output ring oscillator 621, so as to stop the oscillation. Furthermore, the duty cycle of the control pulse $D_{delay}$ is determined by a combination of the AND gate 622 and an inverting delay element D3.

The XOR gate 623 inverts the polarity of the control pulse $D_{delay}$ according to the input signal $D_{in}$ and the output logical value of the AND gate 622. The XOR gate 624 inverts the polarity of the control pulse $D_{delay}$ according to the logical values of the control pulse $D_{delay}$ and the return signal $D_{return}$.

Figure 8:
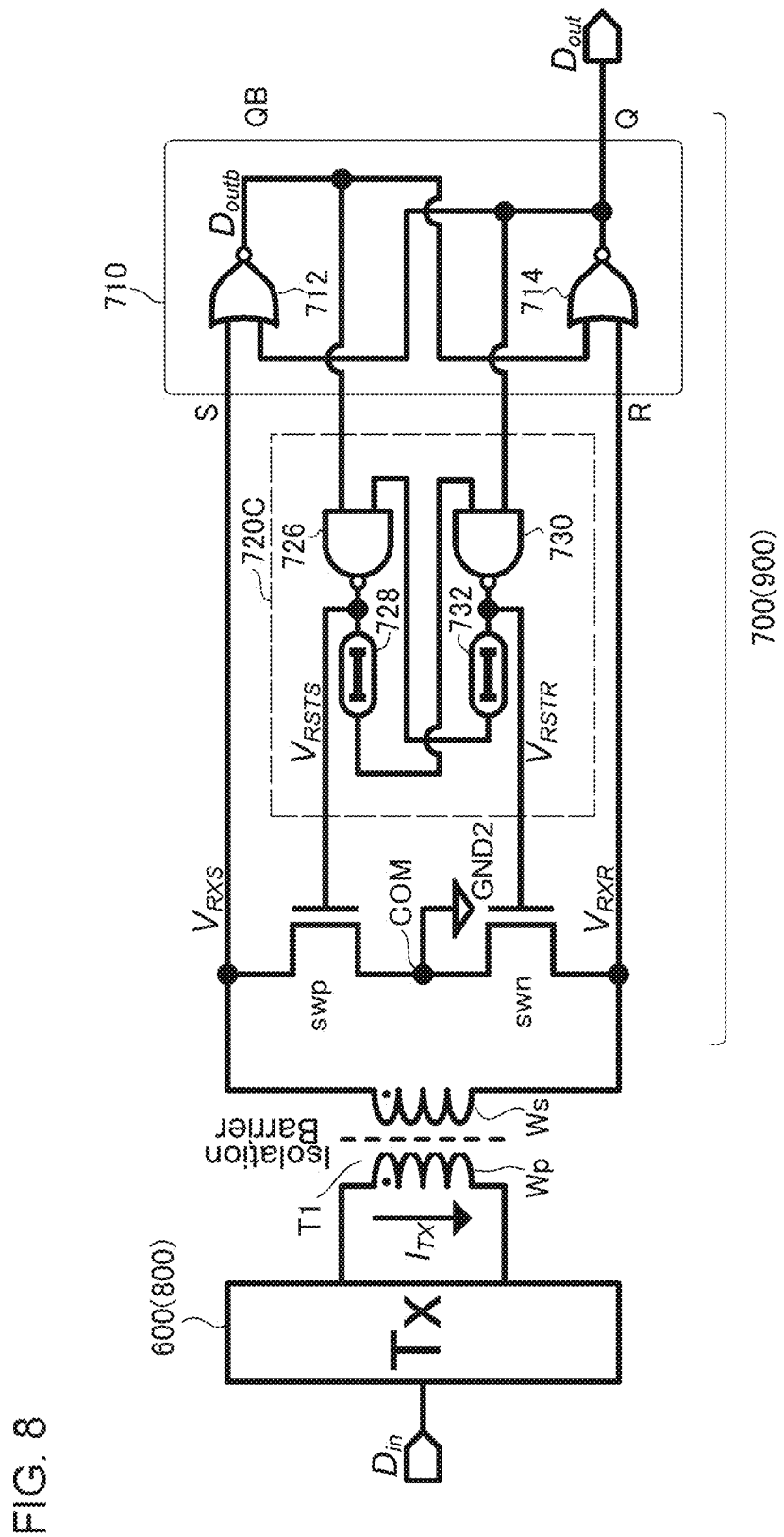
FIG. 8 is a circuit diagram showing an example configuration of a secondary transmitter.

FIG. 8 is a circuit diagram showing an example configuration of the secondary receiver 700. The secondary receiver 700 includes a latch circuit 710, a switch control unit 720C, a first switch swp, and a second switch swn.

The latch circuit 710 is arranged such that its set terminal (S) is coupled to one end of the secondary winding Ws of the transformer T1 and its reset terminal (R) is coupled to the other end of the secondary winding Ws of the transformer T1.

The logical polarity and configuration of the latch circuit 710 are not restricted in particular so long as the latch circuit includes two inputs, i.e., a set input and a reset input. In the present example, the latch circuit 710 is configured as a NOR SR latch including two NOR gates 712 and 714 cross-coupled to each other.

The first switch swp is arranged between a common node COM at which the common voltage $V_{COM}$ occurs and a set terminal (S). When the output $D_{out}$ of the latch circuit 710 is high, the first switch swp is turned on. The second switch swn is provided between the common volage node COM and a reset terminal (R). When the output of the latch circuit 710 is low, the second switch swn is turned on. In this example, as the common voltage $V_{COM}$, the ground voltage GND2 is employed. The first switch swp and the second switch swn are each configured as an NMOS transistor. It should be noted that, as the common voltage $V_{COM}$, the power supply voltage VDD2 may be employed. In this case, the first switch swp and the second switch swn may each be configured as a PMOS transistor.

The switch control unit 720C controls the first switch swp and the second switch swn according to the state of the latch circuit 710, i.e., the logical value of the output signal $D_{out}$.

The switch control unit 720C waits for the transition (trailing edge) of the current pulse $I_{TX}$, and subsequently turns off the first switch swp and the second switch swn. That is to say, the switch control unit 720C turns off the second switch swn after the transition of the pulse current $I_{TX}$ having the first polarity and turns off the first switch swp after the transition of the pulse current $I_{TX}$ having the second polarity.

Here, the switch control unit 720C may employ a simple delay. However, in this example, the switch control unit 720C employs a delay provided by a non-overlap circuit. Atter a predetermined time elapses after the first switch swp is turned on, the switch control unit 720C turns off the second switch swn. After a predetermined time, elapses after the second switch swn is turned on, the switch control unit 720C turns off the first switch swp. With this, a period in which both the first switch swp and the second switch swn are turned on is provided such that both the voltage $V_{RXS}$ at the set terminal and the voltage $V_{RXR}$ at the reset terminal are fixed to the ground GND2. This allows the signal to be further stabilized.

The switch control unit 720C includes a first NAND gate 726, a first delay circuit 728, a second NAND gate 730, and a second delay circuit 732.

The first NAND gate 726 is arranged such that an inverted output $D_{outb}$ of the latch circuit 710 is received via its first input node and its output node is coupled to the gate of the first switch swp. The first delay circuit 728 delays the output $V_{RST1}$ of the first NAND gate 726. The second NAND gate 730 is arranged such that the output $D_{out}$ of the latch circuit 710 is received via its first input node, the output of the first delay circuit 728 is received via its second input node, and its output node is coupled to the gate of the second switch swn. The second delay circuit 732 delays the output $V_{RST2}$ of the second NAND gate 730 and supplies the output $V_{RST2}$ thus delayed to the second input node of the first NAND gate 726.

Figure 9:
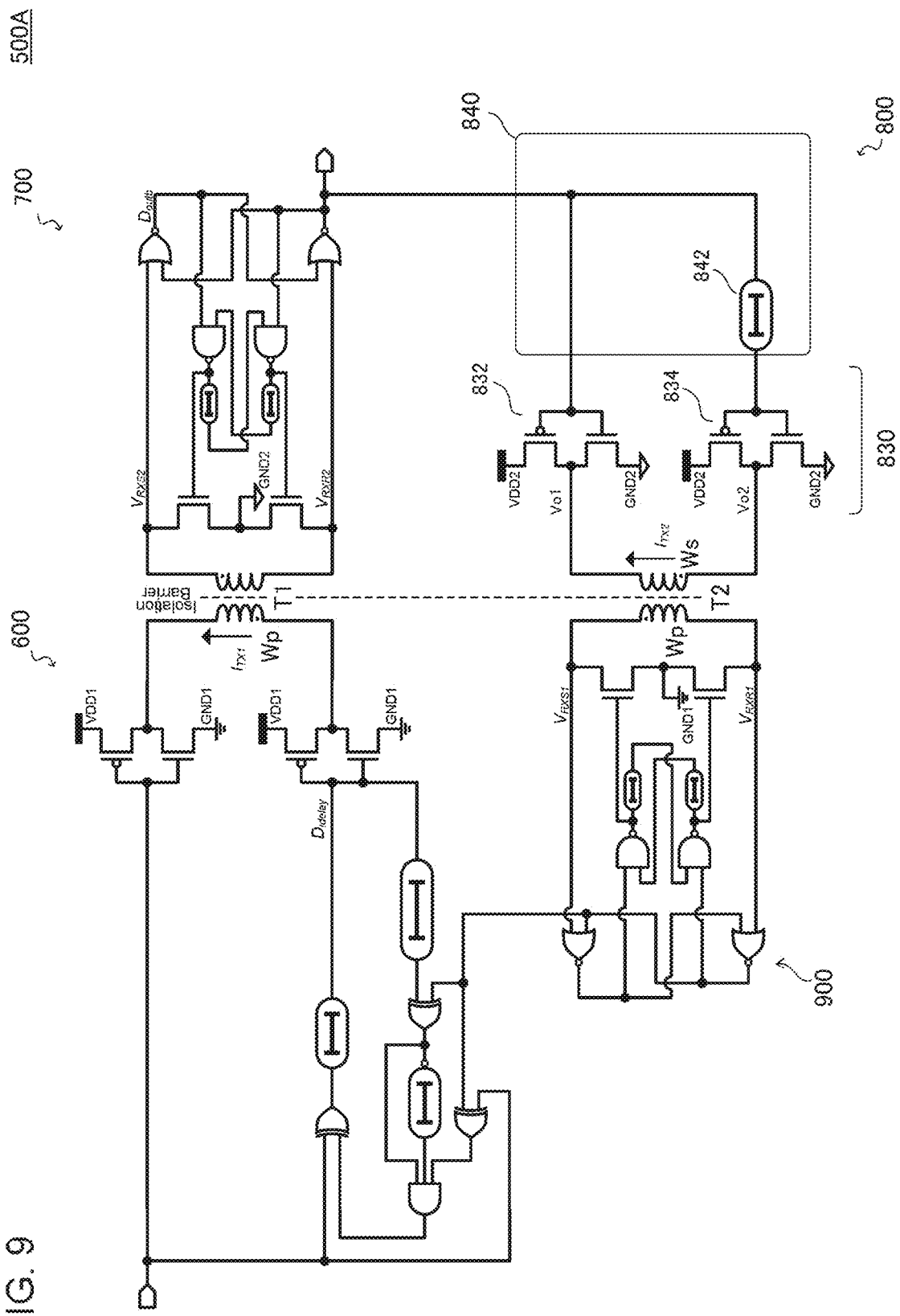
FIG. 9 is a circuit diagram showing an overall example configuration of the transmission circuit.

FIG. 9 is a circuit diagram showing an overall example configuration of the transmission circuit 500A. The primary transmitter 600 and the secondary receiver 700 have the same configurations as those shown in FIGS. 7 and 8. The primary receiver 900 has the same configuration as that of the secondary receiver 700.

The secondary transmitter 800 includes a pre-driver 840 and a second output unit 830. The second output unit 830 is configured as an H-bridge circuit including a pair of push-pull output stages (inverters) 832 and 834. One output stage 832 inverts the output signal $D_{out}$, and supplies the output signal $D_{out}$ thus inverted to one end of the secondary winding Ws of the transformer T2. During a period in which the output signal $D_{out}$ is high, the output Vo1 of the output stage 832 is low (GND2). During a period in which the output signal $D_{out}$ is low, the output Vo1 of the output stage 832 is high (VDD2).

The output stage 834 inverts the control pulse $D_{odelay}$ received from the pre-driver 840 and supplies the control pulse $D_{odelay}$ thus inverted to the other end of the secondary winding Ws of the transformer T2. During a period in which the control pulse $D_{odelay}$ is high, the output Vo2 of the output stage 834 is low (GND12). During a period in which the control pulse $D_{odelay}$ is low, the output Vo2 of the output stage 834 is high (VDD2).

The pre-driver 840 includes a delay circuit 842 that delays the output signal $D_{out}$ so as to generate the delay pulse $D_{odelay}$.

The above is an example configuration of the transmission circuit 500A. Next, description will be made regarding the operation thereof.

Figure 10A:
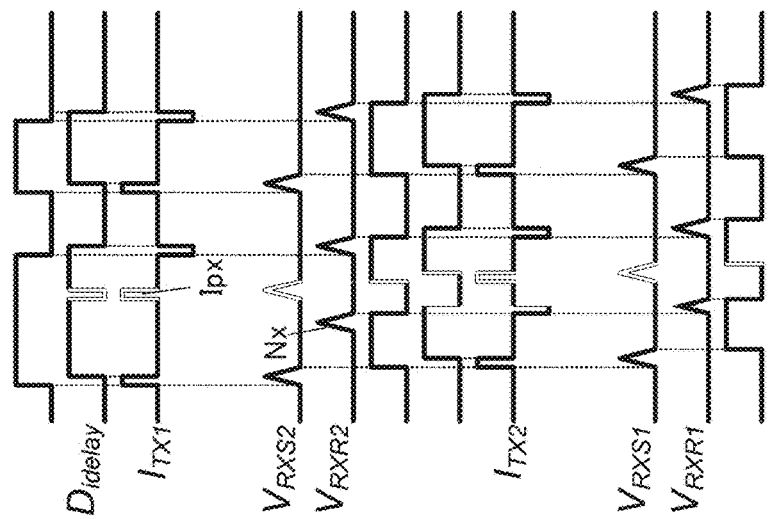
FIGS. 10A through 10C are time charts each showing the operation of the transmission circuit shown in FIG. 9.
Figure 10B:
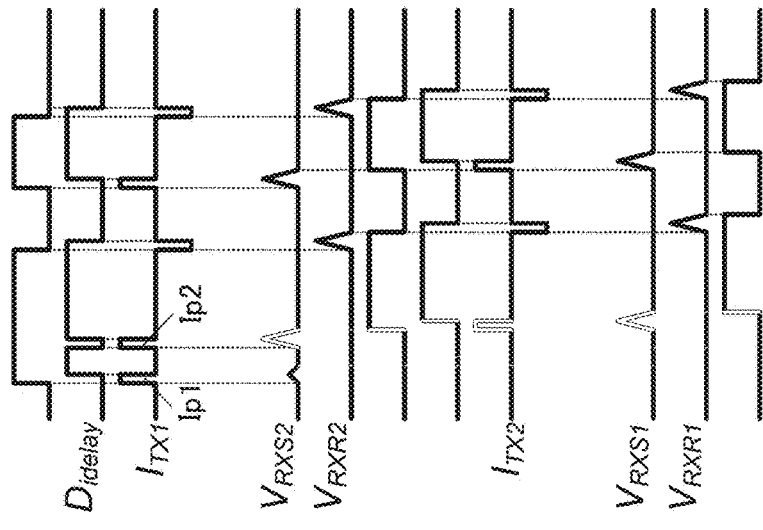
Figure 10C:
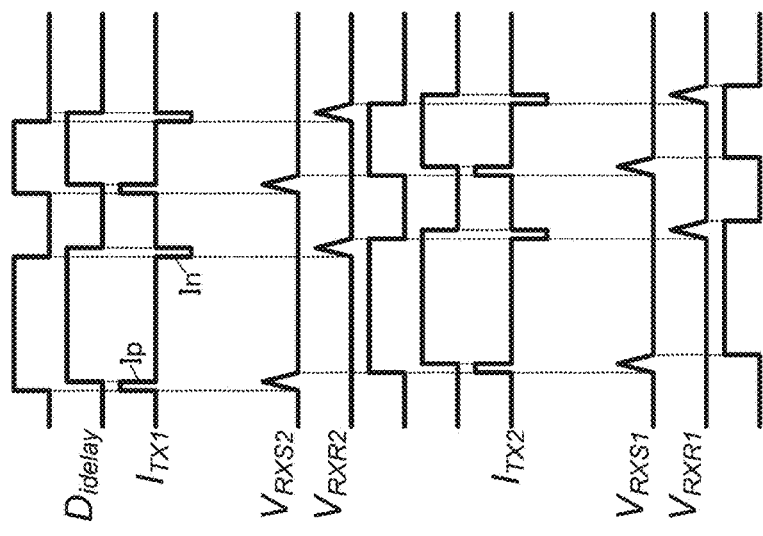

FIGS. 10A through 10C are time charts each showing the operation of the transmission circuit 500A shown in FIG. 9. FIG. 10A shows a normal operation. When the input signal $D_{in}$ transits to high, it becomes a mismatch with the return signal $D_{return}$. Accordingly, the first oscillation circuit 620 is enabled. As a result, the pulse signal Ip having the first polarity is generated.

When the pulse current Ip is transmitted correctly to the secondary side 504, the output signal $D_{out}$ becomes high, and the return signal $D_{return}$ also becomes high. The logical value of the input signal $D_{in}$ matches the logical value of the return signal $D_{return}$. As a result, the first oscillation circuit 620 stops its operation, thereby stopping the pulse current Ip.

When the input signal $D_{in}$ transits to low, it becomes a mismatch with the return signal $D_{return}$. Accordingly, the first oscillation circuit 620 is enabled. As a result, the pulse current In having the second polarity is generated. When the pulse current In is transmitted correctly to the secondary side 504, the output signal $D_{out}$ becomes low, and the return signal $D_{return}$ becomes low. Accordingly, the logical value of the input signal $D_{in}$ matches the logical value of the return signal $D_{return}$. As a result, the first oscillation circuit 620 stops its operation, thereby stopping the pulse current In.

FIG. 10B shows the operation when a failure has occurred in the transmission of the pulse current Ip1 from the primary transmitter 600 to the secondary receiver 700.

When the input signal $D_{in}$ transits to high, it becomes a mismatch with the return signal $D_{return}$. Accordingly, the first oscillation circuit 620 is enabled. As a result, the pulse current Ip1 having the first polarity is generated.

When a failure has occurred in the transmission of the pulse current Ip1, the output signal $D_{out}$ remains low. Accordingly, a mismatch continues between the input signal $D_{in}$ and the return signal $D_{return}$ that indicates the output signal $D_{out}$. As a result, the first oscillation circuit continues to oscillate, and accordingly, the primary transmitter 600 generates a second pulse current Ip2. When the pulse current Ip2 is transmitted successfully, the output signal $D_{out}$ transits to high. Accordingly, the input signal $D_{in}$ matches the return signal $D_{return}$ that indicates the output signal $D_{out}$. As a result, the first oscillation circuit 620 becomes the disable state, and stops its operation. Subsequently, the pulse current Ip is not generated.

FIG. 10C shows an operation when a change has occurred in the input of the secondary receiver 700 due to noise or the like although the input signal $D_{in}$ has not changed.

When noise Nx has occurred in one end $V_{RXR2}$ of the secondary winding Ws of the transformer T1, the output signal $D_{out}$ transits to low, and the return signal $D_{return}$ becomes low. As a result, the input signal $D_{in}$ does not match the return signal $D_{return}$. Accordingly, the first oscillation circuit 620 becomes the enable state. In this state, the input signal $D_{in}$ is high, and accordingly, the pulse current Ipx having the first polarity is generated. When the pulse current Ipx is transmitted to the secondary side 504, the output signal $D_{out}$ transits to high, and accordingly, the return signal $D_{return}$ also becomes high. As a result, the input signal $D_{in}$ matches the return signal $D_{return}$. Accordingly, the first oscillation circuit 620 becomes the disable state.

The above is the operation of the transmission circuit 500A. With the transmission circuit 500, when a mismatch has occurred between the primary side 502 and the secondary side 504, such an arrangement is capable of providing matching between them using a small number of additional transmission pulses Ip and In.

Furthermore, such an arrangement can be configured with only logic circuits that require no steady current flow. Accordingly, when there is no signal transition, current consumption is zero. Accordingly, such an arrangement is capable of operating with only current consumption that is proportional to the data transmission rate, thereby allowing the power consumption to be dramatically reduced.

Example 2

Figure 11B:
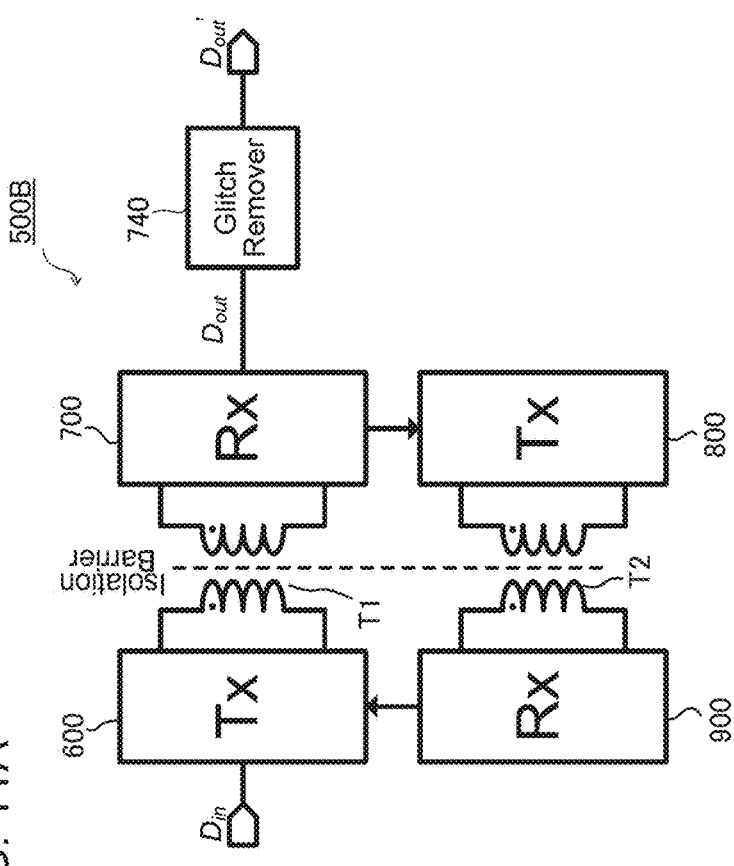
FIGS. 11A and 11B are circuit diagrams of a transmission circuit according to an example 2.
Figure 11A:
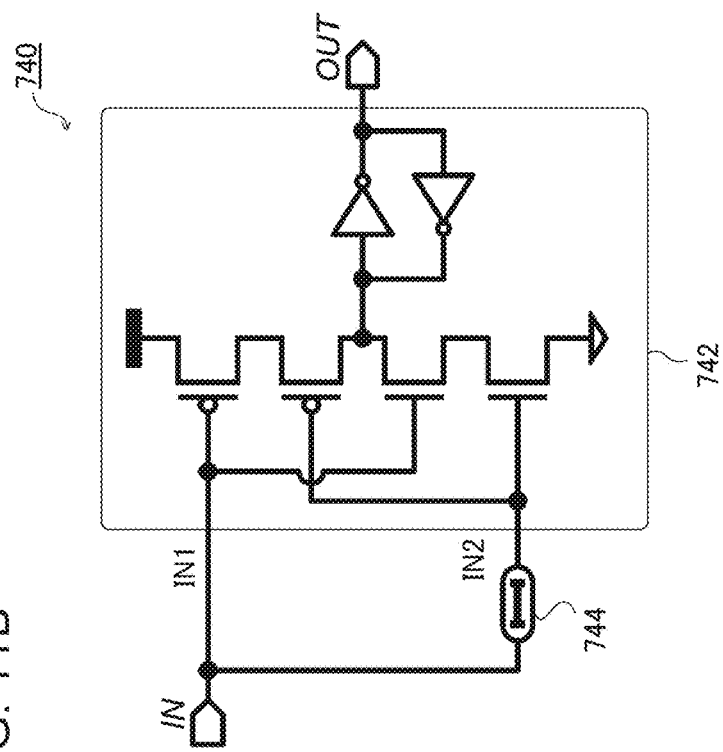

FIGS. 11A and 11B are circuit diagrams each showing a transmission circuit 500B according to an example 2. In the transmission circuit 500B, the secondary receiver 700 further includes a glitch remover circuit 740. As shown in FIG. 11B, the glitch remover circuit 740 includes a hysteresis flip-flop 742 and a delay circuit 744.

The delay circuit 744 delays the input signal (i.e., the output of the secondary receiver 700). The hysteresis flip-flop 742 is arranged such that the input signal is received via its first input node and the output of the delay circuit 744 is received via its second input node. The hysteresis flip-flop 742 is configured as a so-called Muller C-element. When the two inputs IN1 and IN2 are mismatched, the hysteresis flip-flop 742 holds the immediately previous output value. When both the two inputs IN1 and IN2 are low, the hysteresis flip-flop 742 outputs low. When both the two inputs IN1 and IN2 are high, the hysteresis flip-flop 742 outputs high.

With the example 2, such an arrangement is capable of removing a glitch that occurs in the output signal $D_{out}$ in a situation as shown in FIG. 10C with a pulse width that is shorter than the delay provided by the delay circuit 744.

Example 3

With the example 1, when an abnormality has occurred in the return channel, this has the potential to involve the occurrence of unnecessary power consumption or the inability to resolve a mismatch.

Figure 12A:
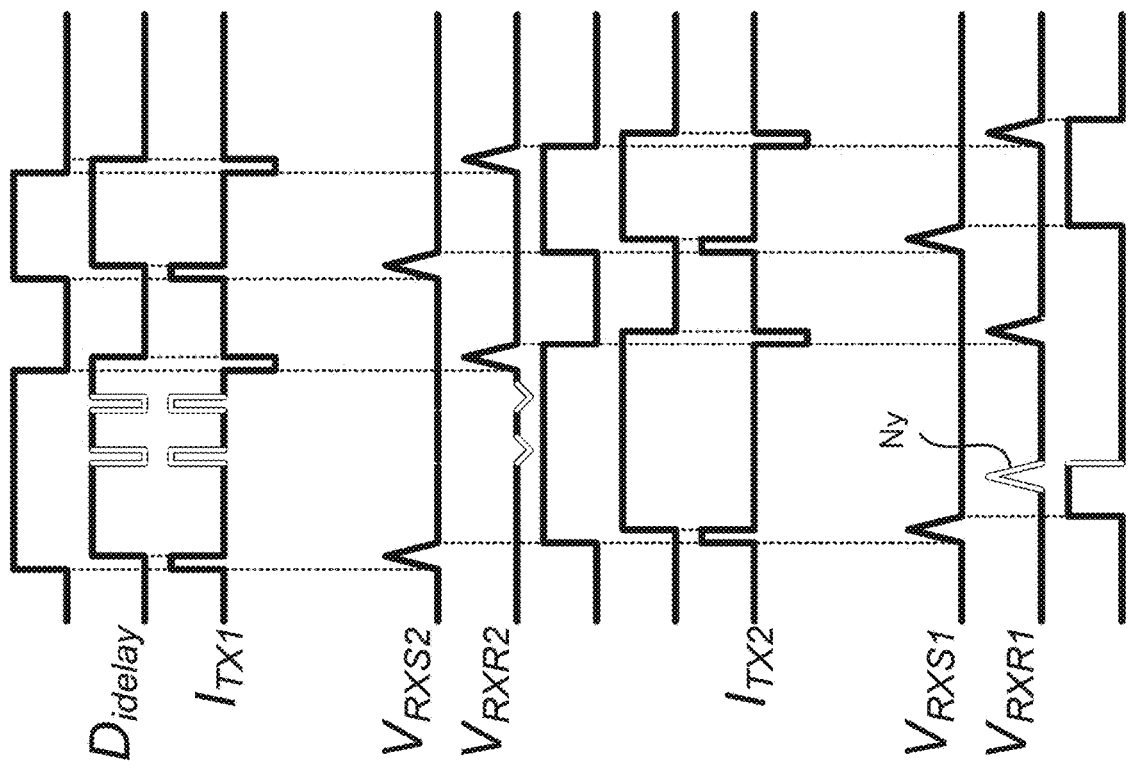
FIGS. 12A and 12B are time charts for explaining a problem that occurs in the transmission circuit shown in FIG. 9.
Figure 12B:
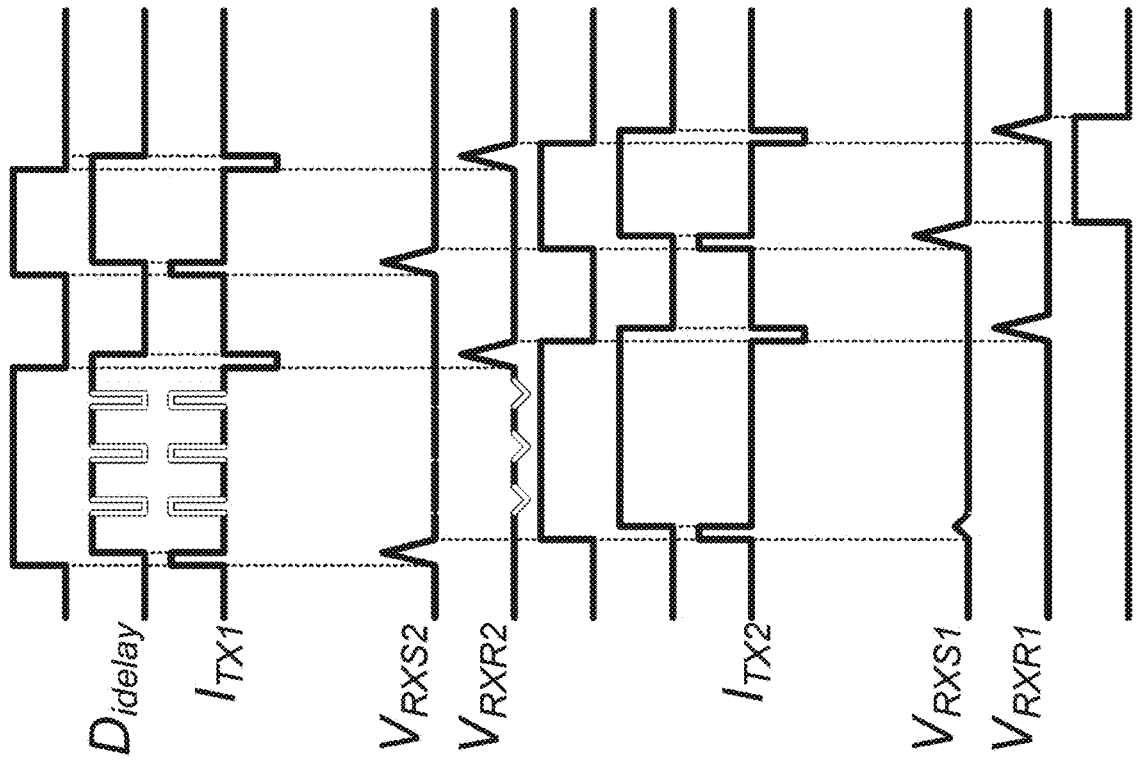

FIGS. 12A and 12B are time charts for explaining problems that occur in the transmission circuit 500A shown in FIG. 9. FIG. 12A shows a case in which the return signal $D_{return}$ cannot be transmitted correctly. In this case, the return signal $D_{return}$ becomes a mismatch with the input signal $D_{in}$ although the logical value of the output signal $D_{out}$ matches the logical value of the input signal $D_{in}$. As a result, the primary transmitter 600 repeatedly generates the pulse current Ip, leading to unnecessary power consumption.

FIG. 12B shows a case in which the return signal $D_{return}$ transits to an incorrect level due to noise Ny. In this case, the primary transmitter 600 repeatedly generates the pulse current Ip having the first polarity. Accordingly, such an arrangement involves unnecessary power consumption.

The mismatches shown in FIGS. 12A and 12B cannot be resolved until transition occurs in the input signal $D_{in}$.

Figure 13:
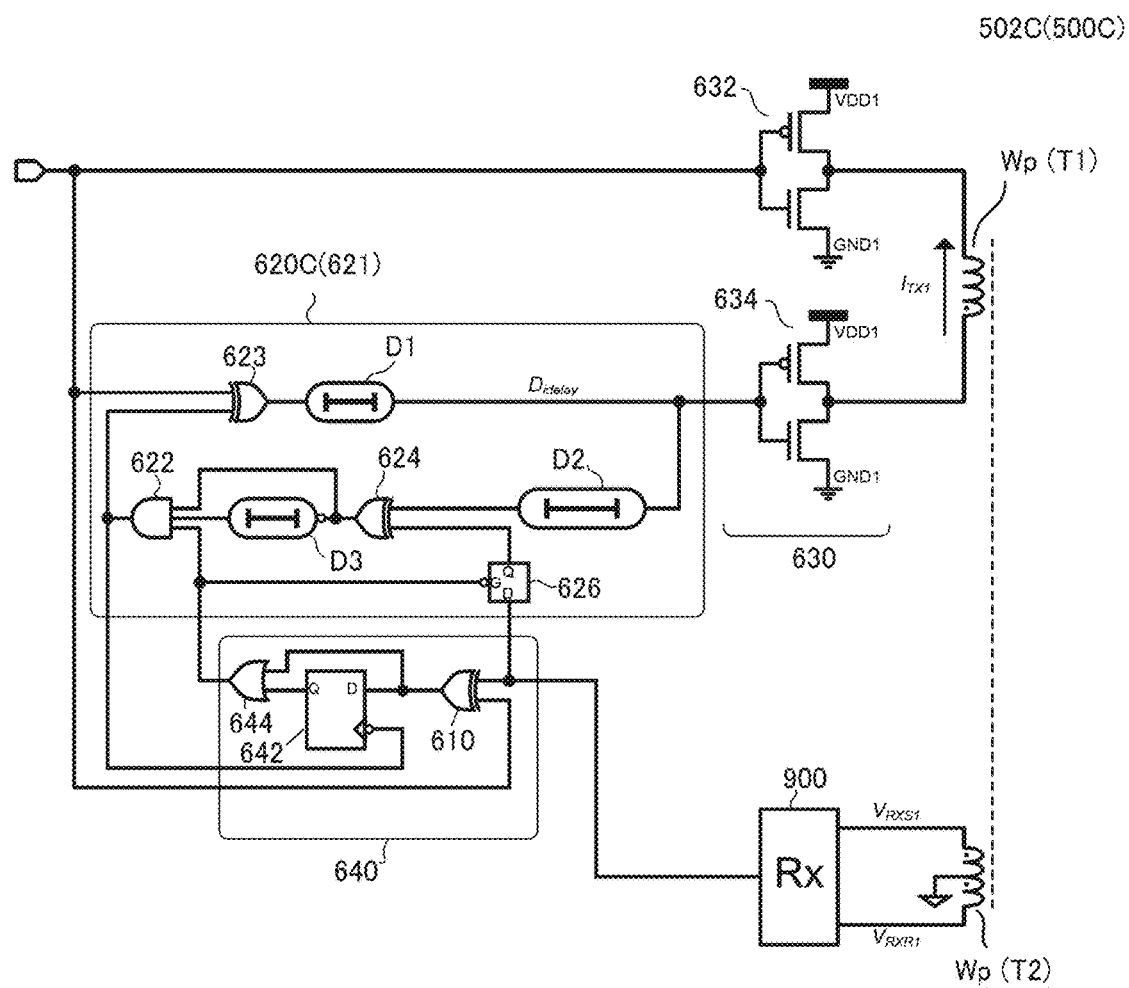
FIG. 13 is a circuit diagram showing a configuration of a primary side of a transmission circuit according to an example 3.

In the example 3, description will be made regarding a configuration for solving this problem. FIG. 13 is a circuit diagram showing a configuration of a primary side 502C of the transmission circuit 500C according to the example 3.

In the example 3, after the logical value of the input signal $D_{in}$ matches the logical value of the return signal $D_{return}$, the primary transmitter 600C drives the primary-side input 512 of the isolation barrier once as an additional operation. That is to say, when the input signal $D_{in}$ is high, an additional pulse current Ip is generated. On the other hand, when the input signal $D_{in}$ is low, an additional pulse current In is generated.

The primary transmitter 600C includes a first oscillation circuit 620C and an oscillator controller 640. The first oscillation circuit 620C is configured as a pulse output ring oscillator 621 with an enable function. The first oscillation circuit 620C further includes a level-sensitive latch (D latch) 626 in addition to the first oscillation circuit 620 shown in FIG. 7. The level-sensitive latch 626 is arranged such that the return signal $D_{return}$ is received via its input node D and an enable signal ENB is input via its gate (negative logic system). During a period in which the enable signal ENB is low, the level-sensitive latch 626 allows the return signal $D_{return}$ to pass through.

The oscillator controller 640 includes a D flip-flop 642 and an OR gate 644 in addition to the first comparison circuit 610. The first comparison circuit 610 judges whether or not the input signal $D_{in}$ matches the return signal $D_{return}$.

The D flip-flop 642 holds the immediately previous output of the first comparison circuit 610. The OR gate 644 outputs the logical OR of the output of the first comparison circuit 610 and the output of the D flip-flop 642. When the input signal $D_{in}$ matches the return signal $D_{return}$ consecutively over two cycles, the enable signal (negative logical system) ENB, which is the output of the OR gate 644, is asserted (becomes low).

With this configuration, after the logical value of the input signal $D_{in}$ matches the logical value of the return signal $D_{return}$, the primary-side input 512 of the isolation barrier is driven once as an additional operation. This is capable of repeatedly generating the control pulse $D_{idelay}$ until the logical value of the input signal $D_{in}$ matches the logical value of the return signal $D_{return}$ twice consecutively.

Figure 14:
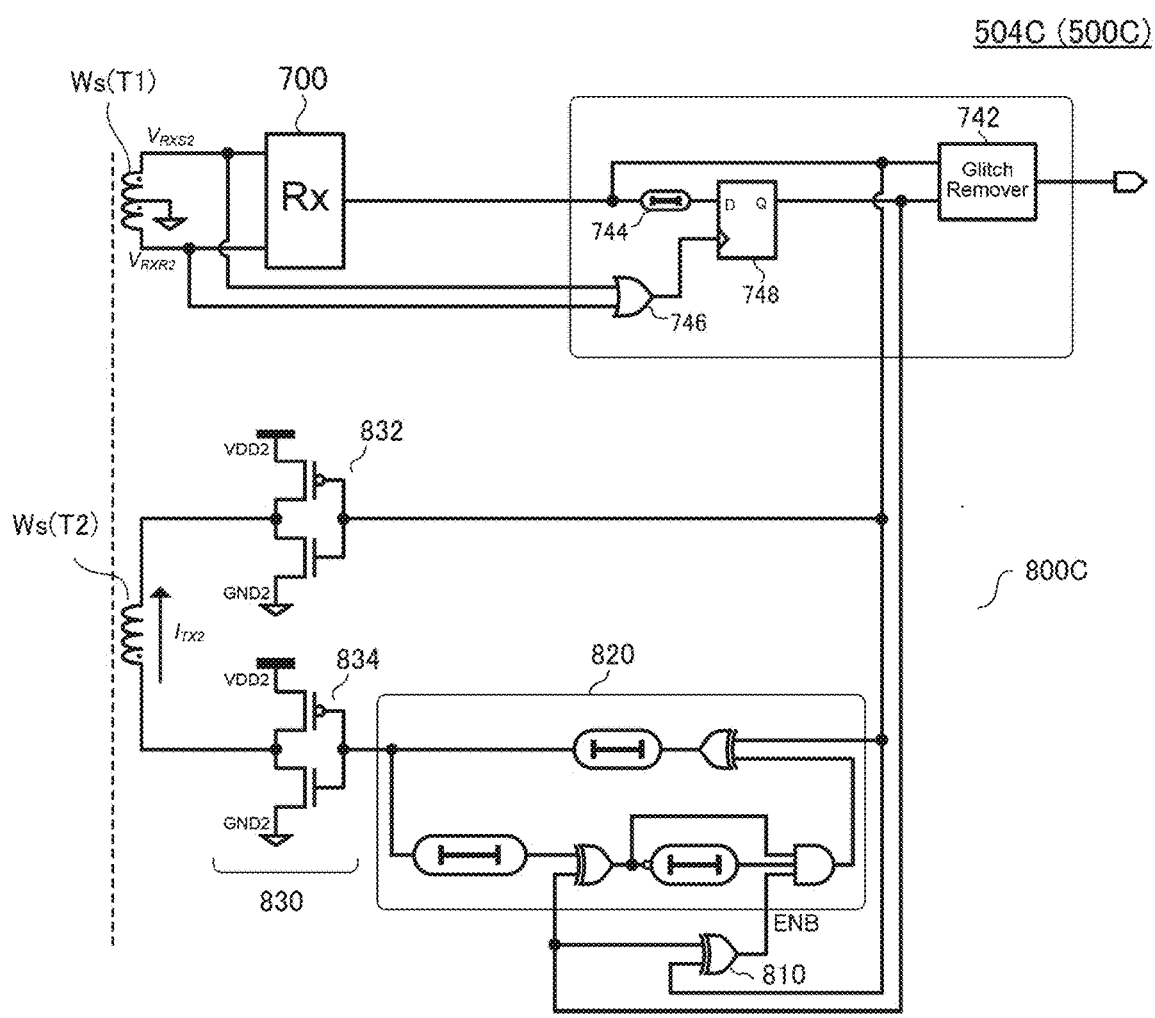
FIG. 14 is a circuit diagram showing a configuration of a secondary side of the transmission circuit according to the example 3.

FIG. 14 is a circuit diagram showing a configuration of a secondary side 504C of the transmission circuit 500C according to the example 3.

The glitch remover circuit 740C includes an OR gate 746 and a D flip-flop 748 in addition to the hysteresis flip-flop 742 and the delay circuit 744. When a voltage signal occurs in the secondary winding Ws of the transformer T1, the output of the OR gate 746 becomes high, and the D flip-flop 748 acquires the output value of the delay circuit 744. The D flip-flop 748 holds the immediately previous output signal $D_{out}$.

During a period in which the current output signal $D_{out0}$ and the immediately previous output signal $D_{out1}$ are mismatched, a secondary transmitter 800C of the transmission circuit 500C repeatedly drives the secondary side of the isolation barrier, i.e., the secondary winding Ws of the transformer T2.

The secondary transmitter 800C may be configured in the same manner as the primary transmitter 600 shown in FIG. 7. The secondary transmitter 800C includes a second comparison circuit 810, a second oscillation circuit 820, and a second output unit 830. The second comparison circuit 810 compares the logical value of the immediately previous output signal $D_{out1}$ with the logical value of the current output signal $D_{out0}$ and generates an enable signal ENB that indicates the comparison result. The second oscillation circuit 820 is configured as a pulse output ring oscillator with an enable function.

Figure 15:
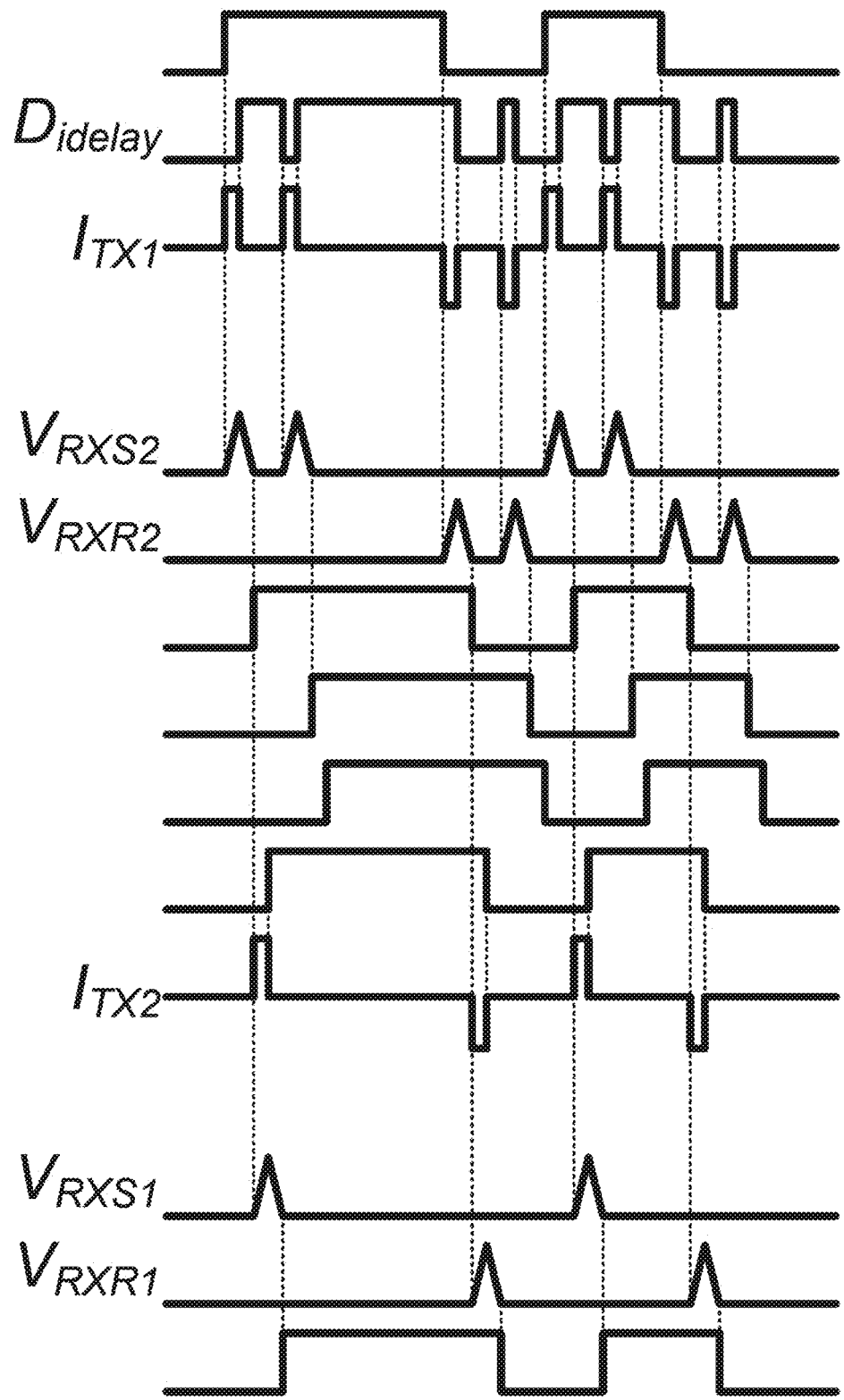
FIG. 15 is a time chart showing the operation of the transmission circuit according to the example 3.

The above is the configuration of the transmission circuit 500C according to the example 3. FIG. 15 is a time chart showing the operation of the transmission circuit 500C according to the example 3.

With the example 3, after the return signal $D_{return}$ is transmitted correctly, the secondary transmitter 800 stops its operation. This provides improved immunity with respect to the occurrence of an abnormality in the return channel.

The embodiments have been described for exemplary purposes only. Rather, it can be readily conceived by those skilled in this art that various modifications may be made by making various combinations of the aforementioned components or processes, which are also encompassed in the technical scope of the present invention or the present disclosure. Description will be made below regarding such modifications.

The configuration of the secondary receiver 700 is not restricted to that shown in FIG. 8. It should be noted that the modifications described below may be applicable to the primary receiver 900.

Modification 1

Figure 16:
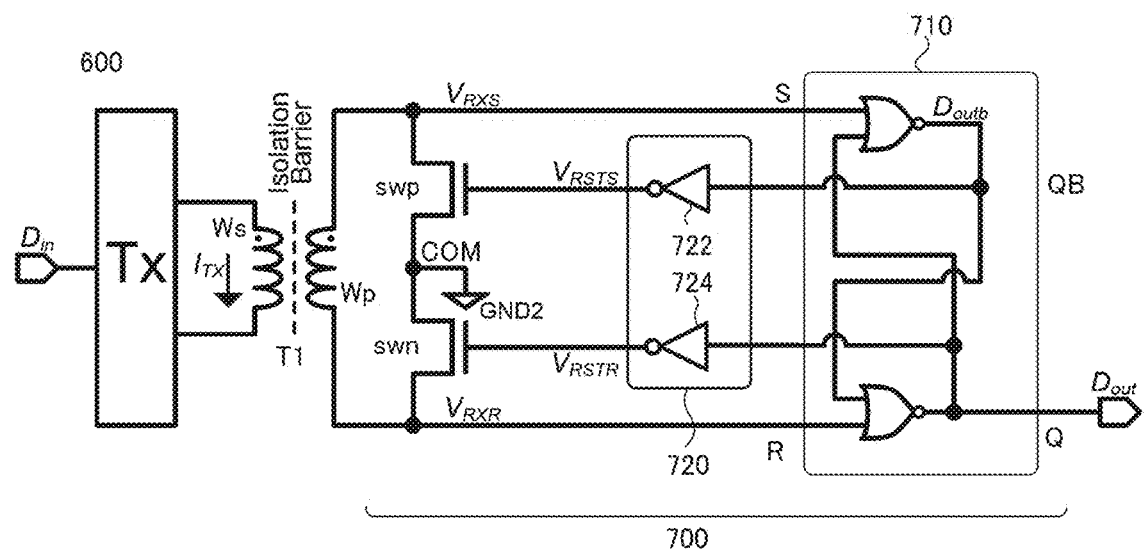
FIG. 16 is a circuit diagram of a secondary receiver according to a modification 1.

FIG. 16 is a circuit diagram showing the secondary receiver 700 according to a modification 1. The switch control unit 720 may be configured with two inverters 722 and 724. The first inverter 722 is arranged such that its input node is coupled to the inverting output QB of the latch circuit 710 and its output node is coupled to the gate of the first switch swp. The second inverter 724 is arranged such that its input node is coupled to the output Q of the latch circuit 710 and its output node is coupled to the gate of the second switch swn.

Modification 2

Figure 17:
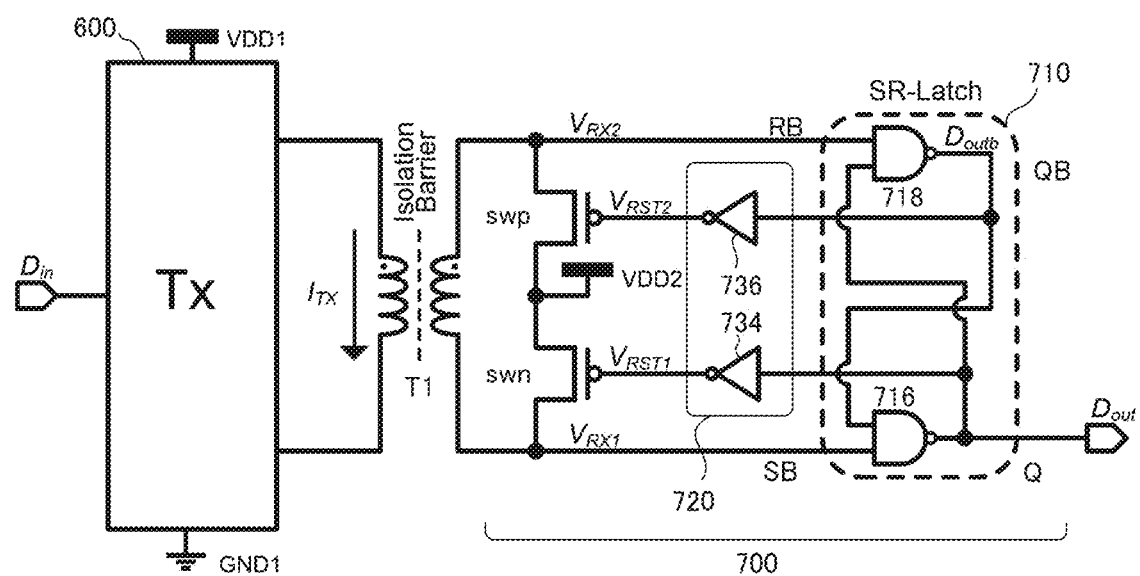
FIG. 17 is a circuit diagram of a secondary receiver according to a modification 2.

FIG. 17 is a circuit diagram of the secondary receiver 700 according to a modification 2. Description has been made above regarding an arrangement in which, as the common voltage $V_{COM}$, the ground voltage GND2 is employed. However, the present invention is not restricted to such an arrangement. In the modification 2, as the common voltage $V_{COM}$, the power supply voltage VDD2 is employed. Furthermore, the first switch swp and the second switch swn are each configured as a PMOS transistor.

Furthermore, in the modification 2, the latch circuit 710 includes a first NAND gate 716 and a second NAND gate 718 cross-coupled to each other. The latch circuit 710 employs a negative logical system. When the voltage $V_{RX1}$ at the set terminal SB transits from high to low, the latch circuit 710 is set. When the voltage $V_{RX2}$ at the reset terminal RB transits from high to low, the latch circuit 710 is reset.

The switch control unit 720 includes a third inverter 734 and a fourth inverter 736. The third inverter 734 is arranged such that the output $D_{out}$ of the latch circuit 710 is received via its input node and its output node is coupled to the gate of the first switch swp. The fourth inverter 736 is arranged such that the inverted output $D_{outb}$ of the latch circuit 710 is received via its input node and its output node is coupled to the gate of the second switch swn.

It should be noted that, as the switch control unit 720, the switch control unit 720C shown in FIG. 8 may be employed.

Modification 3

The configuration of the secondary receiver 700 and the configuration of the primary receiver 900 are not restricted to those described above. Also, the secondary receiver 700 and the primary receiver 900 may be configured using known techniques.

Modification 4

The configurations of the first oscillation circuit and the second oscillation circuit are not restricted to those described above. The order of the components may be swapped. Also, the positive logical polarity and the negative logical polarity may be swapped.

Modification 5

Description has been made in the examples 1 through 3 regarding an arrangement in which the isolation barrier 510 includes two transformers. However, the present invention is not restricted to such an arrangement. Also, an arrangement may be made in which the isolation barrier 510 may include capacitors. In this case, the configurations of the primary transmitter 600, the secondary receiver 700, the secondary transmitter 800, and the primary receiver 900 may preferably be modified based on a known technique that is a so-called capacitor method. Also, an arrangement may be made in which the isolation barrier 510 includes a single transformer so as to provide bidirectional signal transmission/reception.

Usage

Lastly, description will be made regarding the usage of the transmission circuit 500.

Figure 18:
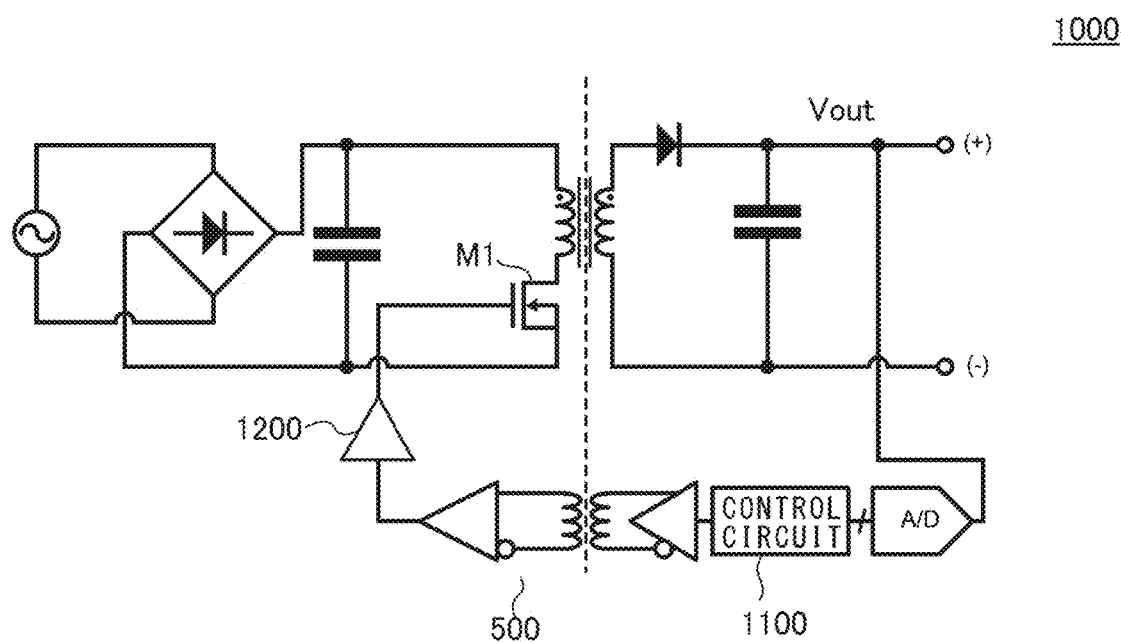
FIG. 18 is a circuit diagram of an isolation converter provided with a transmission circuit.

FIG. 18 is a circuit diagram of an isolation converter 1000 provided with the transmission circuit 500. A controller 1100 is arranged on the secondary side. The controller 1100 generates a pulse signal such that the output voltage $V_{OUT}$ approaches a target value. The transmission circuit 500 receives the pulse signal Sp generated by the controller 1100 as the input signal $D_{in}$ and transmits the input signal $D_{in}$ thus received to the primary side of the isolation converter 1000. A gate driver 1200 drives a switching transistor M1 of the primary side using the gate signal that corresponds to the output signal $D_{out}$ of the transmission circuit 500.

Figure 19:
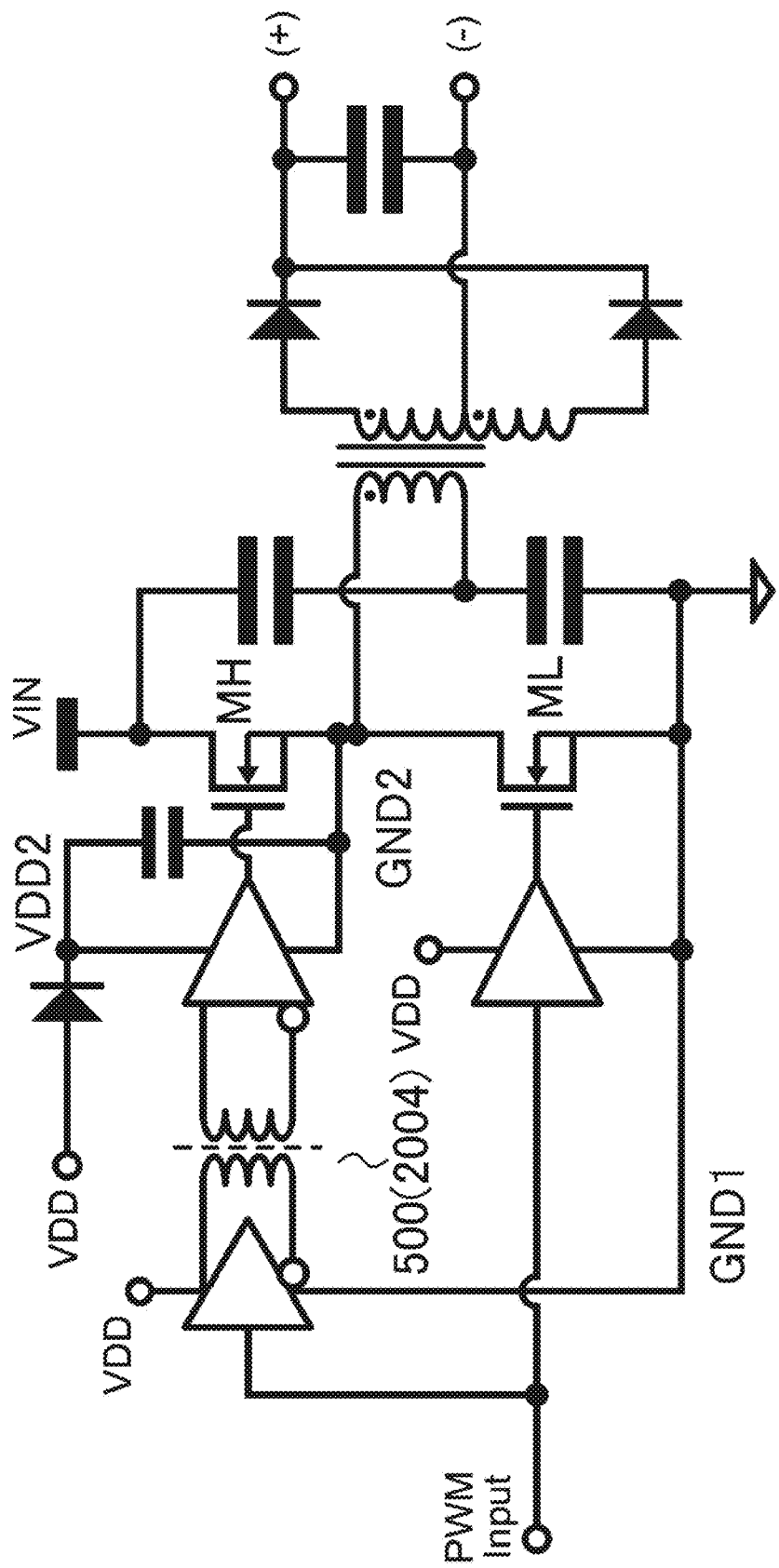
FIG. 19 is a circuit diagram of a half-bridge converter provided with a transmission circuit.

FIG. 19 is a circuit diagram showing a half-bridge converter 2000 provided with the transmission circuit 500. The half-bridge converter 2000 includes a high-side transistor MH and a low-side transistor ML. A gate driver 2002 drives the low-side transistor ML according to the PWM signal.

The high-side transistor MH is configured as an N-channel transistor. A driving circuit 2004 for the high-side transistor MH operates with a voltage $V_{SW}$ at a switching node that couples the high-side transistor MH and the switching transistor ML as a reference (ground GND2). Furthermore, the power supply voltage (VDD2) of the driving circuit 2004 is generated by a bootstrap circuit.

The transmission circuit 500 transmits the PWM signal from a region in which the ground voltage GND1 is employed as a reference to a region in which the ground voltage GND2 ($=V_{SW}$) is employed as a reference.

Description has been made regarding the present invention with reference to the embodiments using specific terms. However, the above-described embodiments show only an aspect of the mechanisms and applications of the present invention. Rather, various modifications and various changes in the layout can be made without departing from the spirit and scope of the present invention defined in appended claims.

The invention claimed is:

1. A transmission circuit comprising:
   an isolation barrier;
   a primary transmitter structured to drive a primary-side input of the isolation barrier in response to a transition of an input signal;
   a secondary receiver structured to generate an output signal having a logical value that corresponds to a signal that occurs at a secondary-side output of the isolation barrier;
   a secondary transmitter structured to drive a secondary-side input of the isolation barrier based on the output signal; and
   a primary receiver structured to generate a return signal having a logical value that corresponds to a signal that occurs at a primary-side output of the isolation barrier,
   wherein the primary transmitter is structured to repeatedly drive the primary-side input of the isolation barrier until a logical value of the input signal matches a logical value of the return signal, and
   wherein the primary transmitter comprises:
      a first comparison circuit structured to compare the logical value of the input signal with the logical value of the return signal;
      a first oscillation circuit structured such that oscillation and stoppage are controlled according to a comparison result obtained by the first comparison circuit; and
      a first output unit structured to drive the primary-side input of the isolation barrier according to the input signal and a first pulse signal generated by the first oscillation circuit.

2. The transmission circuit according to claim 1, wherein the first oscillation circuit comprises a ring oscillator.

3. The transmission circuit according to claim 1, wherein, when the input signal is high, the primary transmitter pulse-drives the primary side of the isolation barrier with a first polarity,
   and wherein, when the input signal is low, the primary transmitter pulse-drives the primary side of the isolation barrier with a second polarity.

4. The transmission circuit according to claim 1, wherein the isolation barrier comprises a first transformer having a primary winding coupled to the primary transmitter, and a secondary winding coupled to the secondary receiver,
   wherein, when the input signal is high, the primary transmitter supplies a pulse current having a first polarity to the primary winding of the first transformer,
   and wherein, when the input signal is low, the primary transmitter generates a pulse current having a second polarity.

5. The transmission circuit according to claim 1, wherein, after a logical value of the input signal matches a logical value of the return signal, the primary transmitter drives the primary-side input of the isolation barrier once as an additional operation,
   and wherein, during a period in which there is a mismatch between a current output signal and an immediately previous output signal, the secondary transmitter repeatedly drives the secondary-side input of the isolation barrier.

6. The transmission circuit according to claim 1, further comprising a glitch remover circuit structured to remove a glitch from an output of the secondary receiver.

7. A transmission circuit comprising:
   an isolation barrier;
   a primary transmitter structured to drive a primary-side input of the isolation barrier in response to a transition of an input signal;
   a secondary receiver structured to generate an output signal having a logical value that corresponds to a signal that occurs at a secondary-side output of the isolation barrier;
   a secondary transmitter structured to drive a secondary-side input of the isolation barrier based on the output signal; and
   a primary receiver structured to generate a return signal having a logical value that corresponds to a signal that occurs at a primary-side output of the isolation barrier,
   wherein the primary transmitter is structured to repeatedly drive the primary-side input of the isolation barrier until a logical value of the input signal matches a logical value of the return signal,
   wherein the isolation barrier comprises a first transformer having a primary winding coupled to the primary transmitter, and a secondary winding coupled to the secondary receiver,
   wherein, when the input signal is high, the primary transmitter supplies a pulse current having a first polarity to the primary winding of the first transformer,
   wherein, when the input signal is low, the primary transmitter generates a pulse current having a second polarity, and
   wherein the secondary receiver comprises:
      a latch circuit having a set terminal coupled to one end of the secondary winding of the first transformer and a reset terminal coupled to the other end of the secondary winding of the transformer;
      a first switch coupled between the set terminal and a common voltage node at which a common voltage occurs, and structured to turn on when an output of the latch circuit is high; and
      a second switch coupled between the common voltage node and the reset terminal, and structured to turn on when the output of the latch circuit is low.

8. The transmission circuit according to claim 7, wherein the secondary receiver further comprises a switch control unit structured to control the first switch and second switch according to a state of the latch circuit,
   and wherein, after a transition of a pulse current having the first polarity, the switch control unit turns off the second switch, and wherein, after a transition of a pulse current having the second polarity, the switch control unit turns off the first switch.

9. The transmission circuit according to claim 8, wherein when a predetermined time period elapses after the first switch turns on, the switch control unit turns off the second switch, and wherein when a predetermined time period elapses after the second switch turns on, the switch control unit turns off the first switch.

10. A transmission circuit comprising:

an isolation barrier;

a primary transmitter structured to drive a primary-side input of the isolation barrier in response to a transition of an input signal;

a secondary receiver structured to generate an output signal having a logical value that corresponds to a signal that occurs at a secondary-side output of the isolation barrier;

a secondary transmitter structured to drive a secondary-side input of the isolation barrier based on the output signal; and a primary receiver structured to generate a return signal having a logical value that corresponds to a signal that occurs at a primary-side output of the isolation barrier, wherein the primary transmitter is structured to repeatedly drive the primary-side input of the isolation barrier until a logical value of the input signal matches a logical value of the return signal, wherein, after a logical value of the input signal matches a logical value of the return signal, the primary transmitter drives the primary-side input of the isolation barrier once as an additional operation, wherein, during a period in which there is a mismatch between a current output signal and an immediately previous output signal, the secondary transmitter repeatedly drives the secondary-side input of the isolation barrier, and wherein the secondary transmitter comprises:

a second comparison circuit structured to compare an immediately previous logical value of the output signal with a current logical value of the output signal;

a second oscillation circuit structured to control oscillation and stoppage according to a comparison result obtained by the second comparison circuit; and a second output unit structured to drive the secondary-side input of the isolation barrier according to a second pulse signal generated by the second oscillation circuit during a period in which the second oscillation circuit oscillates.

* * * * *